(12) United States Patent
Choi et al.

(10) Patent No.: US 9,412,453 B2
(45) Date of Patent: Aug. 9, 2016

(54) MEMORY SYSTEM AND METHOD OF DETERMINING A FAILURE IN THE MEMORY SYSTEM

(71) Applicant: Samsung Electronics Co., Ltd., Suwon-Si, Gyeonggi-Do (KR)

(72) Inventors: Yoon-Hee Choi, Hwaseong-si (KR); Daeseok Byeon, Seongnam-si (KR); Byunggil Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/536,843

(22) Filed: Nov. 10, 2014

(65) Prior Publication Data

US 2015/0270005 A1    Sep. 24, 2015

(30) Foreign Application Priority Data

Mar. 20, 2014    (KR) .................. 10-2014-0032879

(51) Int. Cl.
| | | |
|---|---|---|
| *G11C 16/00* | (2006.01) | |
| *G11C 16/08* | (2006.01) | |
| *G11C 8/08* | (2006.01) | |
| *G11C 8/18* | (2006.01) | |
| *G11C 29/02* | (2006.01) | |
| *G11C 29/50* | (2006.01) | |
| *G11C 16/34* | (2006.01) | |
| *G11C 29/12* | (2006.01) | |

(52) U.S. Cl.
CPC *G11C 16/08* (2013.01); *G11C 8/08* (2013.01); *G11C 8/18* (2013.01); *G11C 29/025* (2013.01); *G11C 29/50012* (2013.01); *G11C 16/3454* (2013.01); *G11C 2029/1202* (2013.01)

(58) Field of Classification Search
CPC .......... G11C 16/3454; G11C 16/3459; G11C 16/5628
USPC .......... 365/185.11, 200, 203, 185.21, 185.19, 365/185.22, 185.18
See application file for complete search history.

(56) References Cited

U.S. PATENT DOCUMENTS

| | | |
|---|---|---|
| 5,428,621 A | 6/1995 | Mehrotra et al. |
| 6,545,910 B2 | 4/2003 | Byeon et al. |
| 7,012,836 B2 | 3/2006 | Matsubara et al. |
| 7,212,454 B2 | 5/2007 | Kleveland et al. |
| 7,512,014 B2 | 3/2009 | Tran et al. |
| 8,085,609 B2 | 12/2011 | Shinoda |
| 8,379,454 B2 | 2/2013 | Kochar et al. |
| 8,379,455 B2 | 2/2013 | Kuroda |
| 8,432,732 B2 | 4/2013 | Li et al. |
| 8,432,737 B2 | 4/2013 | Shiga |
| 8,514,630 B2 | 8/2013 | Huynh et al. |

(Continued)

FOREIGN PATENT DOCUMENTS

KR    10-2005-0108976 A    11/2005

*Primary Examiner* — Connie Yoha
(74) *Attorney, Agent, or Firm* — Harness, Dickey & Pierce

(57) ABSTRACT

An operating method of a memory system which includes a nonvolatile memory device including memory cells connected to a plurality of word lines, the operating method including pre-charging a selected one of the plurality of word lines; detecting a variation in a voltage or a current on the selected word line after the selected word line is floated; generating runtime failure information according to the detected variation; and determining a state of the selected word line or a state of a memory block including the selected word line, based on the runtime failure information.

18 Claims, 17 Drawing Sheets

(56) References Cited

U.S. PATENT DOCUMENTS

| | | |
|---|---|---|
| 2002/0145907 A1 | 10/2002 | Byeon et al. |
| 2003/0185063 A1* | 10/2003 | Yang .................... G11C 29/02 |
| | | 365/200 |
| 2004/0264245 A1 | 12/2004 | Matsubara et al. |
| 2006/0098493 A1 | 5/2006 | Tran et al. |
| 2006/0291303 A1 | 12/2006 | Kleveland et al. |
| 2010/0188896 A1 | 7/2010 | Shinoda |
| 2011/0194345 A1 | 8/2011 | Kuroda |
| 2012/0008384 A1 | 1/2012 | Li et al. |
| 2012/0008410 A1* | 1/2012 | Huynh ................... G11C 29/02 |
| | | 365/185.21 |
| 2012/0051134 A1 | 3/2012 | Shiga |
| 2012/0281479 A1 | 11/2012 | Kochar et al. |
| 2013/0194868 A1 | 8/2013 | Hashimoto |
| 2013/0215697 A1* | 8/2013 | Choi ........................ G11C 8/08 |
| | | 365/203 |

* cited by examiner

MEMORY SYSTEM AND METHOD OF DETERMINING A FAILURE IN THE MEMORY SYSTEM

CROSS-REFERENCE TO RELATED APPLICATIONS

A claim for priority under 35 U.S.C. §119 is made to Korean Patent Application No. 10-2014-0032879 filed Mar. 20, 2014, in the Korean Intellectual Property Office, the entire contents of which are hereby incorporated by reference.

FIELD

The inventive concepts described herein relate to a memory system, and more particularly, relate to a memory system including a nonvolatile memory device and an operating method thereof.

BACKGROUND

Semiconductor memory devices are separated into volatile memory devices and nonvolatile memory devices. Read and write speeds of the volatile memory devices are fast, but they lose contents stored therein at power-off. In contrast, nonvolatile memory devices retain contents stored therein even at power-off. Thus, nonvolatile memory devices are used to store contents that must be retained regardless of whether a power is supplied. In particular, among nonvolatile memory devices, a flash memory device is advantageous to an appliance to an auxiliary mass storage device in that it is highly integrated in relation to a conventional EEPROM.

With advances in the technology and lowering of prices of the flash memory device, the flash memory device is being used as a storage medium for replacing a hard disk drive (HDD). A storage device using the flash memory device may have been fabricated in various ways. Such a storage device may be used as a solid state drive (SSD), an SD card, and so on. The storage device contains a controller to control the flash memory device.

The flash memory device has been fabricated by a fine process technology to increase a degree of integration. In the flash memory device, a space between word lines may decrease in proportion to an increase in the degree of integration. Thus, as well as fail-out of the flash memory device, runtime failure may increase.

SUMMARY

Some embodiments of the inventive concepts provide an operating method of a memory system which includes a nonvolatile memory device including memory cells connected to a plurality of word lines, the operating method comprising pre-charging a selected one of the plurality of word lines; detecting a variation in a voltage or a current on the selected word line after the selected word line is floated; generating runtime failure information according to the detected variation; and determining a state of the selected word line or a state of a memory block including the selected word line, based on the runtime failure information.

In some example embodiments, the selected word line or the memory block including the selected word line is determined as a normal state when a value of the runtime failure information is greater than a first reference value.

In some example embodiments, the selected word line or the memory block including the selected word line is determined as a defective state when a value of the runtime failure information is smaller than a second reference value, the second reference value is smaller than the first reference value, and access to the selected word line or the memory block including the selected word line is blocked.

In some example embodiments, when a value of the runtime failure information is between the first reference value and the second reference value, the runtime failure information about the selected word line is detected whenever an erase operation is performed.

Another aspect of some embodiments of the inventive concepts is directed to provide a memory system comprising a nonvolatile memory device configured to pre-charge a selected word line, detects a variation in a voltage or a current on the selected word line, and generates runtime failure information according to the detected variation; and a controller configured to determine a state of the selected word line or a state of a memory block including the selected word line, based on the runtime failure information.

In some example embodiments, the nonvolatile memory device comprises a memory cell array including memory cells connected to word lines and bit lines; an address decoder configured to provide a pre-charge voltage to a selected one of the word lines; a voltage generator configured to generate the pre-charge voltage; and control logic configured to generate the runtime failure information according to a result of detecting a variation in a voltage or a current on the selected word line after the selected word line is pre-charged with the pre-charge voltage.

In some example embodiments, the pre-charge voltage includes a program voltage or a read voltage.

In some example embodiments, the control logic comprises a sample/hold circuit configured to convert the detected voltage or current of the selected word line into a step-shaped sample/hold voltage; and an analog-to-digital converter configured to convert the sample/hold voltage into the runtime failure information.

In some example embodiments, the control logic further comprises a comparing unit configured to compare the runtime failure information with a reference code to generate a word line pass signal or a word line fail signal; and a pass/fail output unit configured to generate pass/fail information in response to the word line pass signal or the word line fail signal.

In some example embodiments, the controller is configured to block an access of the selected word line or the memory block including the selected word line according to the pass/fail information.

In some example embodiments, the controller is configured to set the selected word line or the memory block including the selected word line to a normal state when a value of the runtime failure information is greater than a first reference value.

In some example embodiments, the controller is configured to set the selected word line or the memory block including the selected word line to a defective state when a value of the runtime failure information is smaller than a second reference value, the second reference value is smaller than the first reference value, and the controller configured to block an access to the selected word line or the memory block including the selected word line.

In some example embodiments, when a value of the runtime failure information is between the first reference value and the second reference value, the runtime failure information about the selected word line is detected whenever an erase operation is performed.

In some example embodiments, the nonvolatile memory device pre-charges the selected word line and detects a voltage on the selected word line after a developing time elapses.

In some example embodiments, the nonvolatile memory device is configured to convert the detected voltage or current of the selected word line into a digital code to generate the runtime failure information.

Still another aspect of some embodiments of the inventive concepts is directed to provide a nonvolatile memory device comprising a memory cell array including memory cells connected to word lines and bit lines; an address decoder configured to provide a pre-charge voltage to a selected one of the word lines; a voltage generator configured to generate the pre-charge voltage; and control logic configured to detect a variation in a voltage or a current on the selected word line after the selected word line is pre-charged with the pre-charge voltage and to generate the runtime failure information according to a variation in a voltage or a current on the selected word line.

In some example embodiments, the control logic comprises a runtime failure detecting unit configured to convert a variation in a voltage or a current on the selected word line into a digital code to generate the runtime failure information.

In some example embodiments, the runtime failure detecting unit comprises a sample/hold circuit configured to convert the detected voltage or current of the selected word line into a step-shaped sample/hold voltage; and an analog-to-digital converter configured to convert the sample/hold voltage into the runtime failure information.

In some example embodiments, the runtime failure detecting unit further comprises a comparing unit configured to compare the runtime failure information with a reference code to generate a word line pass signal or a word line fail signal; and a pass/fail output unit configured to generate pass/fail information in response to the word line pass signal or the word line fail signal.

In some example embodiments, the pre-charge voltage is a program voltage or a read voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
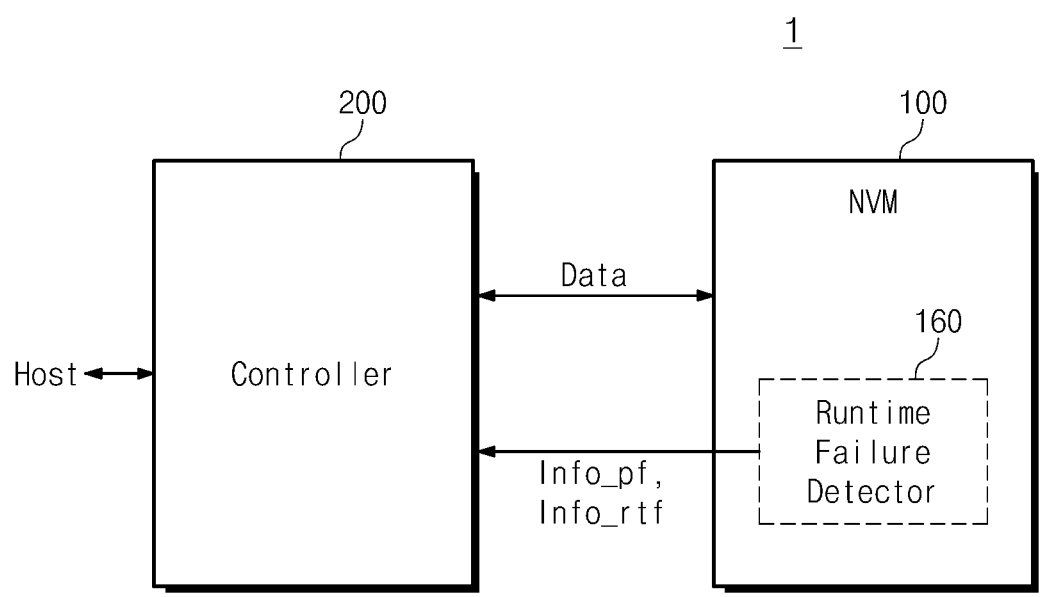
FIG. 1 is a block diagram schematically illustrating a memory system according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a memory system including a nonvolatile memory device will be used as an example of a storage device or an electronic device to described features and functions of the inventive concepts. The features of the inventive concepts will be described under condition that data is transferred by the sector. However, the inventive concepts is not limited thereto. One skilled in the art may understand other features or performance of the inventive concepts easily according to contents disclosed in this specification. Also, a NAND flash memory device will be described for example as a storage medium, but the storage medium may be formed of other nonvolatile memory devices. For example, the storage medium may be formed of, but not limited to, a phase-change RAM (PRAM), a magnetic RAM (MRAM), a resistive RAM (ReRAM), a ferroelectric RAM (FRAM), or a NOR flash memory.

The inventive concepts may be implemented by or applied to different embodiments or applied. Further, detailed description may be modified or changed according to viewpoints and applications without escaping from the scope, spirit, and other objects of the inventive concepts. Below, the inventive concepts will be described with reference to accompanying drawings.

The term "selected memory block" may be used to indicate a memory block, selected for programming, erasing, or reading, from among a plurality of memory blocks. The term "selected sub block" may be used to indicate a sub block, selected for programming, erasing, or reading, from among a plurality of sub blocks in one memory block.

The term "selected bit line" or "selected bit lines" may be used to indicate a bit line or bit lines, connected to a cell transistor to be programmed or read, from among a plurality of bit lines. The term "unselected bit line" or "unselected bit lines" may be used to indicate a bit line or bit lines, connected to a cell transistor to be program-inhibited or read-inhibited, from among a plurality of bit lines.

The term "selected string selection line" may be used to indicate a string selection line, connected to a cell string including a cell transistor to be programmed or read, from among a plurality of string selection lines. The term "unselected string selection line" or "unselected string selection lines" may be used to indicate a remaining string selection line or remaining string selection lines other than the selected string selection line. The term "selected string selection transistors" may be used to indicate string selection transistors connected to a selected string selection line. The term "unselected string selection transistors" may be used to indicate string selection transistors connected to an unselected string selection line or unselected string selection lines.

The term "selected ground selection line" may be used to indicate a ground selection line, connected to a cell string including a cell transistor to be programmed or read, among a plurality of ground selection lines. The term "unselected ground selection line" may be used to indicate a remaining ground selection line or remaining ground selection lines other than the selected ground selection line. The term "selected ground selection transistors" may be used to indicate ground selection transistors connected to a selected ground selection line. The term "unselected ground selection transistors" may be used to indicate ground selection transistors connected to an unselected ground selection line or unselected ground selection lines.

The term "selected word line" may be used to indicate a word line, connected to a cell transistor to be programmed or read, from among a plurality of word lines. The term "unselected word line" or "unselected word lines" may be used to indicate a remaining word line or remaining word lines other than the selected word line.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than the selected memory cell or the selected memory cells.

Embodiments of the inventive concepts will be described for example with reference to a NAND flash memory. However, the technical idea of the inventive concepts is not limited thereto. The technical idea of the inventive concepts may be applied to nonvolatile memory devices. such as, but not limited to, an electrically erasable and programmable ROM (EEPROM), a NOR flash memory, a phase-change RAM (PRAM), a magnetic RAM (MRAM), a resistive RAM (RRAM), and a ferroelectric RAM (FRAM).

FIG. 1 is a block diagram schematically illustrating a memory system according to an embodiment of the inventive concepts. Referring to FIG. 1, a memory system 1 contains a nonvolatile memory device 100 and a controller 200 to control the nonvolatile memory device 100.

The nonvolatile memory device 100 may be, but not limited to, a NAND flash memory device, a vertical NAND flash memory device (or, referred to as VNAND), a NOR flash memory device, a resistive RAM (RRAM) device, a phase-change RAM (PRAM) device, a magneto-resistive RAM (MRAM) device, a ferroelectric RAM (FRAM) device, or a Spin Transfer Torque RAM (STT-RAM). Further, the nonvolatile memory device 100 can be implemented to have a three-dimensional array structure. The inventive concepts may be applied to a Charge Trap Flash (CTF) memory device, including a charge storage layer formed of an insulation film, as well as a flash memory device including a charge storage layer formed of a conductive floating gate. For ease of description, the case that the nonvolatile memory device 100 is a NAND flash memory device will be described for example.

The nonvolatile memory device 100 may have failure that occurs at a manufacturing process. In general, such a failure may be referred to as fail-out. An access to a failed-out memory block may be blocked through a test operation. Also, the nonvolatile memory device 100 may have runtime failure that occurs when programming, reading, and erasing are repeated. For example, the runtime failure may occur between word lines, between a word line and string selection line, between a word line and a ground selection line, or between a word line and a common source line. The memory system 1 of the inventive concepts quantifies the runtime failure to detect a word line with the runtime failure.

The memory system 1 many manage the runtime failure word line thus detected. For example, the memory system 1 may make up an address list on the runtime failure word line thus detected. Probability that the runtime failure word line becomes a defective word line due to continuous use may be high. Whether to switch the runtime failure word line into a defective word line may be determined every erase operation.

Thus, reliability of the memory system 1 may be improved by managing a runtime failure word line.

The nonvolatile memory device 100 exchanges data with the controller 200. The nonvolatile memory device 100 receives data to be programmed that the controller 200 outputs according to a storage command received from a host. The nonvolatile memory device 100 outputs data stored therein to the controller 200. The nonvolatile memory device 100 transfers pass/fail information Info_pf and runtime failure information Info_rtf to the controller 200. The nonvolatile memory device 100 includes a runtime failure detector 160 that generates the pass/fail information Info_pf and the runtime failure information Info_rtf.

The controller 200 is connected to the nonvolatile memory device 100. The controller 200 is configured to access the nonvolatile memory device 100. For example, the controller 200 is configured to control a read operation, a write operation, an erase operation, and a background operation of the nonvolatile memory device 100. The controller 200 provides an interface between the nonvolatile memory device 100 and a host. The controller 200 is configured to drive firmware for controlling the nonvolatile memory device 100.

The controller 200 receives the pass/fail information Info_pf and the runtime failure information Info_rtf from the nonvolatile memory device 100. The controller 200 blocks an access to a word line where failure occurs, based on the pass/fail information Info_pf. The controller 200 blocks an access to a memory block including a word line where failure occurs, based on the pass/fail information Info_pf. The controller 200 sets a state of a word line where runtime failure occurs based on the runtime failure information Info_rtf.

In example embodiments, the controller 200 may include components such as, but not limited to, a RAM, a processing unit, a host interface, a memory interface, and an error correcting unit.

The controller 200 may communicate with an external device (e.g., a host) according to a specific communication protocol. For example, the controller 200 may communicate with the external device through at least one of a variety of interface protocols, such as, but not limited to, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a Firewire protocol.

The controller 200 and the nonvolatile memory device 100 may be integrated in a single semiconductor device. For example, the controller 200 and the nonvolatile memory device 100 are integrated in a single semiconductor device to form a memory card. For example, the controller 200 and the nonvolatile memory device 100 are integrated in a single semiconductor device to form a memory card, such as, but not limited to, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), or a universal flash storage (UFS).

The controller 200 and the nonvolatile memory device 100 are integrated in a single semiconductor device to form a solid state drive (SSD). The SSD includes storage that is configured to store data in a semiconductor memory. In case that the memory system 1 is used as the SSD, the operating speed of the host connected to the memory system 1 may be improved markedly.

As another example, the memory system 1 may be provided as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of a variety of electronic devices constituting a home network, one of a variety of electronic devices constituting a computer network, one of a variety of electronic devices constituting a telematics network, a radio frequency identification (RFID) device, or one of various components constituting a computing system.

The nonvolatile memory device 100 or the controller 200 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 2:
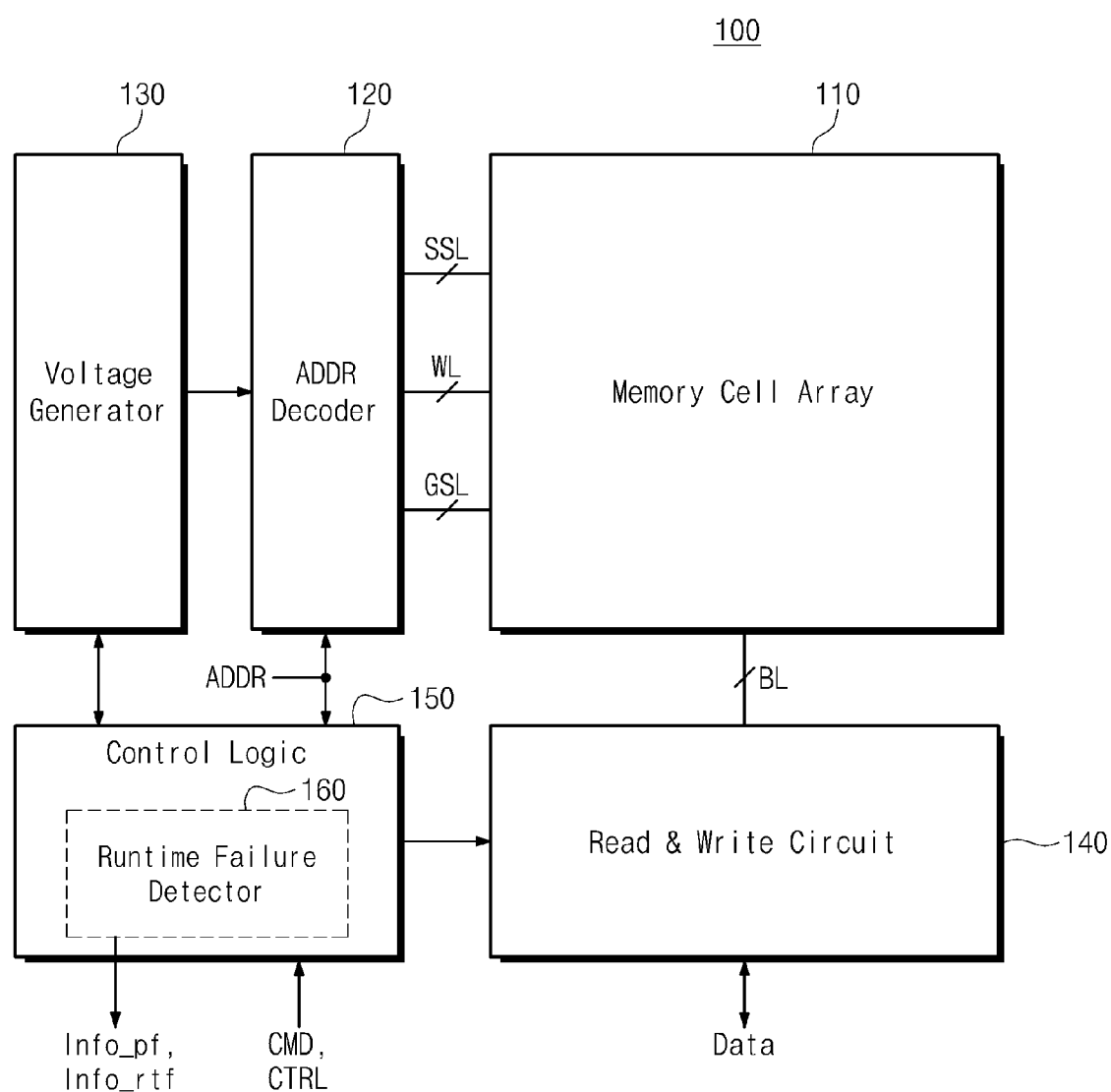
FIG. 2 is a block diagram schematically illustrating a nonvolatile memory device shown in FIG. 1.

FIG. 2 is a block diagram schematically illustrating a nonvolatile memory device shown in FIG. 1. Referring to FIG. 2, a nonvolatile memory device 100 includes a memory cell array 110, an address decoder 120, a voltage generator 130, a read/write circuit 140, and control logic 150.

The memory cell array 110 is connected to the address decoder 120 through string selection lines SSL, word lines WL and ground selection lines GSL and to the read/write circuit 140 through bit lines BL. The memory cell array 110 includes a plurality of memory blocks. Memory cells of each memory block may be formed to have a two-directional structure. Or, memory cells of each memory block may be stacked in a direction perpendicular to a substrate to form a three-dimensional structure. Each memory block may encompass a plurality of memory cells and a plurality of selection transistors. The memory cells are connected to the word lines WL, and the selection transistors are connected to the string selection lines SSL or the ground selection lines GSL. Each memory cell may store one or more data bits.

The address decoder 120 is connected to the memory cell array 110 through the string selection lines SSL, the word lines WL, and the ground selection lines GSL. The address decoder 120 is configured to operate in response to the control of the control logic 150. The address decoder 120 receives an address ADDR from a controller 200 (refer to FIG. 1).

The address decoder 120 is configured to decode a row address of the received address ADDR. The address decoder 120 selects the string selection lines SSL, the word lines WL, and the ground selection lines GSL using the decoded row address. The address decoder 120 receives a variety of voltages from the voltage generator 130 to provide the received voltages to the string selection lines SSL, the word lines WL, and the ground selection lines GSL.

The address decoder 120 is configured to decode a column address of the received address ADDR. The decoded column address may be provided to the read/write circuit 140. For example, the address decoder 120 may include, but not limited to, a row decoder, a column address, and an address buffer.

The voltage generator 130 is configured to generate a variety of voltages that the nonvolatile memory device 100 requires. For example, the voltage generator 130 may produce a plurality of program voltages, a plurality of pass voltages, a plurality of selection read voltages, and a plurality of non-selection read voltages. One of the program voltages and the selection read voltages may be uses as a word line precharge voltage.

The read/write circuit 140 is connected to the memory cell array 110 through bit lines BL and exchanges data with the controller 200. The read/write circuit 140 operates in response to the control of the control logic 150. The read/write circuit 140 receives the decoded column address from the address decoder 120. The read/write circuit 140 selects the bit lines BL using the decided column address.

The read/write circuit 140 receives data from the external device and writes the received data at the memory cell array 110. The read/write circuit 140 reads data from the memory cell array 110 and transfers the read data to the external device. The read/write circuit 140 reads data from a first storage region of the memory cell array 110 and writes the read data at a second storage region of the memory cell array 110. For example, the read/write circuit 140 performs a copy-back operation.

The read/write circuit 140 may include elements such as, but not limited to, a page buffer (or page register), a column selection circuit, and a data buffer. In another example, the read/write circuit 140 may include elements such as, but not limited to, a sense amplifier, a write driver, and a column selection circuit.

The control logic 150 is connected to the address decoder 120, the voltage generator 130, and the read/write circuit 140. The control logic 150 is configured to control the overall operation of the nonvolatile memory device 100. The control logic 150 operates in response to a control signal CTRL transferred from the controller 200.

Figure 3:
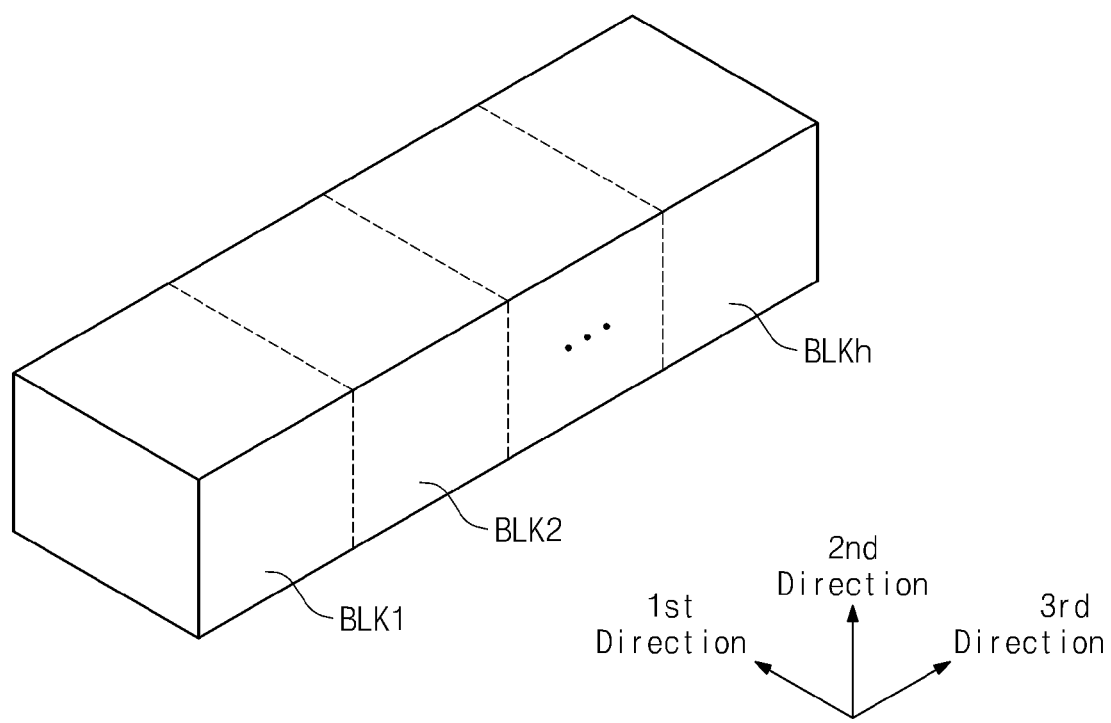
FIG. 3 is a block diagram schematically illustrating a memory cell array shown in FIG. 2.

FIG. 3 is a block diagram schematically illustrating a memory cell array shown in FIG. 2. Referring to FIG. 3, a memory cell array 110 includes a plurality of memory blocks BLK1 to BLKh. Each memory block BLK has a three dimensional structure (or vertical structure). For example, each memory block BLK includes structures extending along first to third directions. For example, each memory block BLK includes a plurality of NAND strings NS extending along the second direction. For example, a plurality of NAND strings NS may be provided along the first and third directions.

Each NAND string NS is connected to a bit line BL, a string selection line SSL, a ground selection line GSL, word lines WL, and a common source line CSL. Each of the memory blocks BLK1 to BLKh is connected to a plurality of bit lines BL, a plurality of string selection lines SSL, a plurality of ground selection lines GSL, a plurality of word lines WL, and the common source line CSL. The memory blocks BLK1 to BLKh will be more fully described with reference to FIG. 4.

Figure 4:
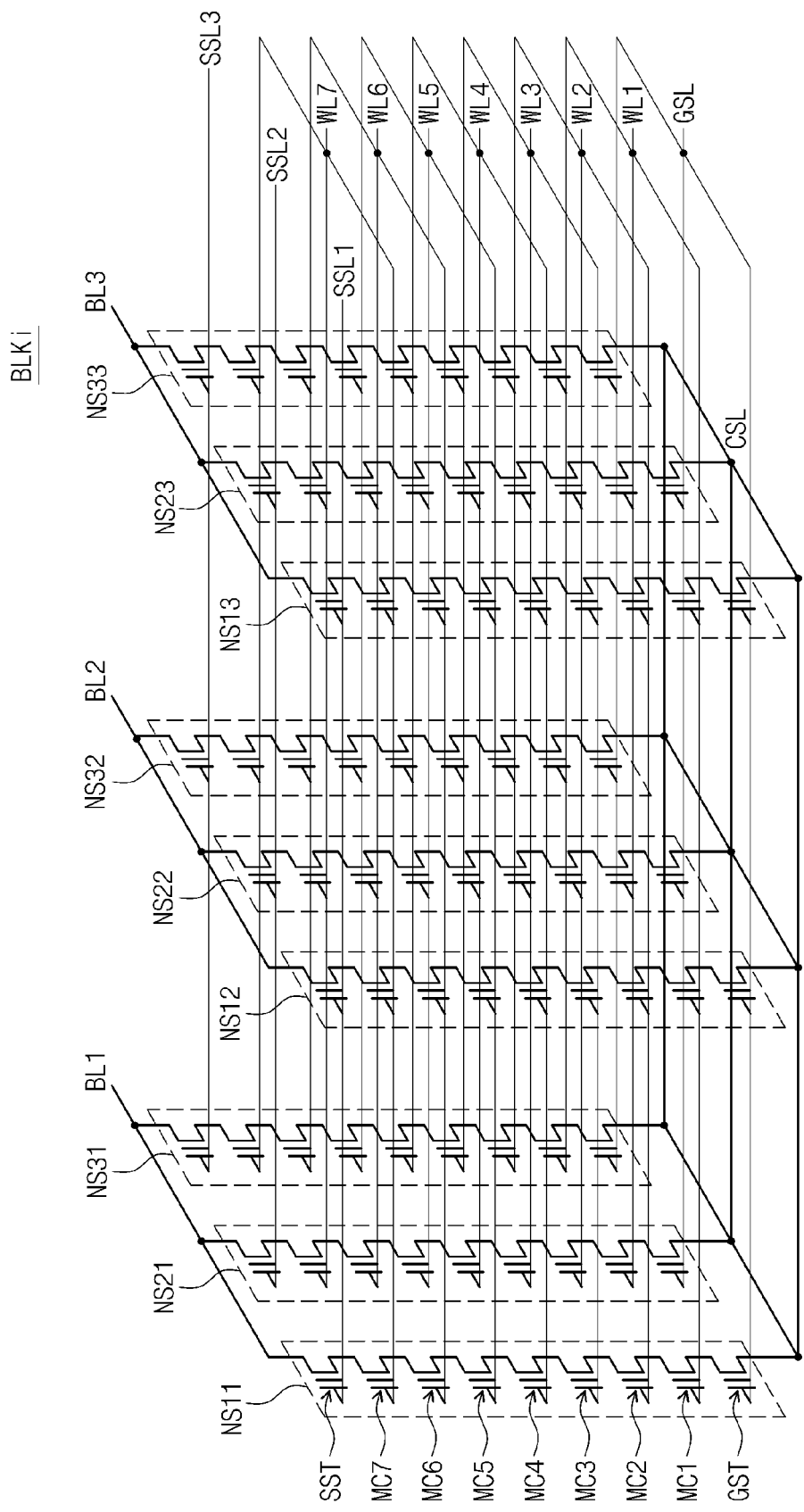
FIG. 4 is an equivalent circuit of one of memory blocks shown in FIG. 3.

FIG. 4 is an equivalent circuit of one BLKi of memory blocks BLK1 to BLKh shown in FIG. 3. Referring to FIG. 4, NAND strings NS11, NS21, and NS31 are provided between a first bit line BL1 and a common source line CSL. NAND strings NS12, NS22, and NS32 are provided between a second bit line BL2 and the common source line CSL. NAND strings NS13, NS23 and NS33 are provided between a third bit line BL3 and the common source line CSL.

Each NAND string NS includes a string selection transistor SST, a ground selection transistor GST, and a plurality of memory cells MC connected between the string selection transistor SST and the ground selection transistor GST. The string selection transistor SST of each NAND string NS is connected to a corresponding bit line BL. The ground selection transistor GST of each NAND string NS is connected to the common source line CSL.

Below, the NAND strings NS are defined by the row and by the column. The NAND strings NS connected in common to one bit line BL form one column. For example, the NAND strings NS11 to NS 31 connected to a first bit line BL1 correspond to a first column. The NAND strings NS12 to NS 32 connected to a second bit line BL2 correspond to a second column. The NAND strings NS13 to NS 33 connected to a third bit line BL3 correspond to a third column.

The NAND strings NS connected to one string selection line SSL form one row. For example, the NAND strings NS11 to NS13 connected to the first string selection line SSL1 form a first row. The NAND strings NS21 to NS23 connected to the second string selection line SSL2 form a second row. The NAND strings NS31 to NS33 connected to the third string selection line SSL3 form a third row.

A height is defined in each NAND string NS. For example, in each NAND string NS, the height of the ground selection transistor GST is defined as 1. In each NAND string NS, the closer a memory cell is to the string selection transistor SST, the higher the height of the memory cell MC1 is. In each NAND string NS, the height of the memory cell MC7 adjacent to the string selection transistor SST is defined as 7.

NAND strings NS in the same row share a string selection line. NAND strings NS in different rows are connected to different string selection lines. The NAND strings NS11 to NS13, NS21 to NS22, and NS31 to NS33 share the ground selection line GSL. NAND strings NS that have the same height and belong to different rows are connected in common.

The common source line CSL is connected in common to the NAND strings NS11 to NS13, NS21 to NS22, and NS31 to NS33.

As illustrated in FIG. 4, word lines with the same height are connected in common. When a specific word line is selected, all NAND strings NS connected to the specific word line WL are selected. Since NAND strings in different rows are connected to different string selection lines SSL1 to SSL3, NAND strings NS, belonging to an unselected row, from among the NAND strings NS11 to NS13, NS21 to NS22, and NS31 to NS33 connected to the same word line are separated from the bit lines BL1 to BL3 by selecting the string selection lines SSL1 to SSL3. That is, a row of NAND strings NS may be selected by selecting one, corresponding to a row to be selected, from among the string selection lines SSL1 to SSL3. NAND strings NS in the selected row are selected by the column by selecting the bit lines BL1 to BL3.

Figure 5:
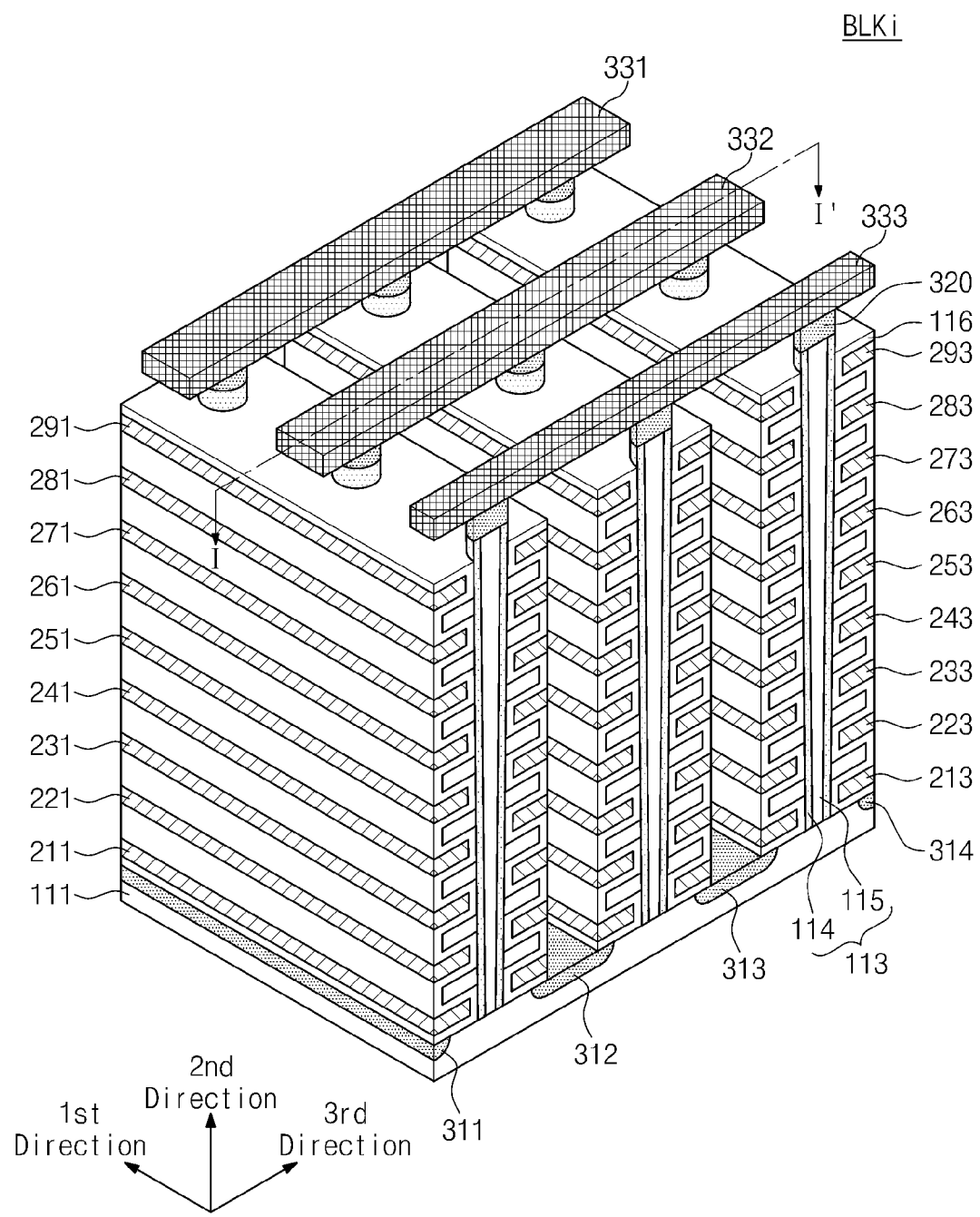
FIG. 5 is a perspective view illustrating an embodiment of one memory block shown in FIG. 4.
Figure 6:
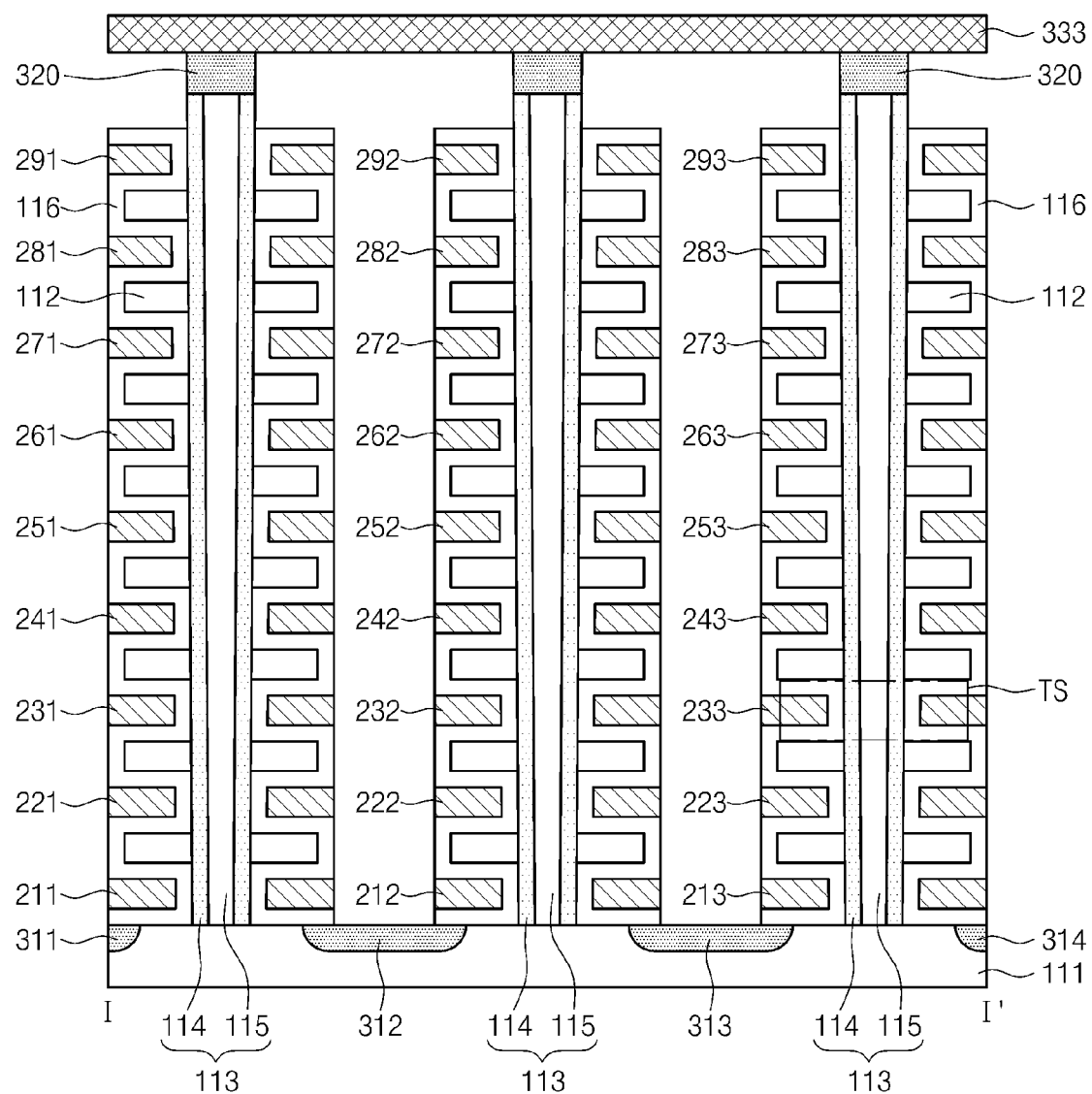
FIG. 6 is a cross-sectional view taken along a line I-I' of a memory block shown in FIG. 5.

FIG. 5 is a perspective view illustrating an embodiment of one memory block BLKi shown in FIG. 4. FIG. 6 is a cross-sectional view taken along a line I-I' of a memory block BLKi shown in FIG. 5. Referring to FIGS. 5 and 6, a memory block BLKi includes structures extending along first to third directions.

First, a substrate 111 is provided. The substrate 111 may include a silicon material that is doped with a first-type impurity. For example, the substrate 111 may include a p-type silicon material. For example, the substrate 111 may be a p-type well (e.g., a pocket p-well). Hereinafter, it is assumed that the substrate 111 be formed of p-type silicon well. However, the inventive concepts is not limited thereto.

A plurality of doping regions 311 to 314 extending along the first direction are provided in the substrate 111. For example, the plurality of doping regions 311 to 314 may have a second type that is different from the substrate 111. Hereinafter, it is assumed that the first to fourth doping regions 311 to 314 are n-type. However, the conductive types of the first to fourth doping regions 311 to 314 are not limited to the n-type.

A plurality of insulation materials 112 extending along the first direction are sequentially provided along the second direction over a region of the substrate 111 between the first and second doping regions 311 and 312. For example, the plurality of insulation materials 112 may be provided along the second direction such that they are spaced by a desired (or, alternatively a predetermined distance). The insulation material 112 may include silicon oxide.

A plurality of pillars 113 are provided along the first direction, which are disposed on the region of the substrate 111 between the first and second doping regions 311 and 312 and penetrate the insulation materials 112 along the second direction. For example, the pillars 113 penetrate the insulation materials 112 to be in contact with the substrate 111.

Each of the pillars 113 may be composed of a plurality of materials. For instance, a surface layer 114 of each pillar 113 may include a silicon material having a first type. For example, the surface layer 114 of each pillar 113 may include a silicon material having the same type as the substrate 111. Hereinafter, it is assumed that the surface layer 114 of each pillar 113 includes p-type silicon. However, the surface layer 114 of each pillar 113 is not limited to including p-type silicon.

An inner layer 115 of each pillar 113 is composed of an insulation material. For example, the inner layer 115 of each pillar 113 may include an insulation material such as silicon oxide.

In a region between the first and second doping regions 311 and 312, an insulation layer 116 is provided along exposed surfaces of the insulation materials 112, the pillars 113, and the substrate 111. A thickness of the insulation film 116 may be smaller than half a distance between the insulation layers 116. That is, a region, in which any material other than the insulation materials 112 and the insulation layer 116 may be disposed, may be provided between the insulation layer 116 provided on an undersurface of the first insulation material and the insulation layer 116 provided on a top surface of the second insulation material under the first insulation material of the insulation material 112.

In a region between the first and second doping regions 311 and 312, first conductive materials 211 to 291 are provided on an exposed surface of the insulation layer 116. For example, the first conductive material 211 extending along the first direction is provided between the substrate 111 and the insulation layer adjacent thereto. More specifically, the first conductive material 211 extending along the first direction is provided between the substrate 111 and the insulation layer 116 disposed under the insulation material 112 adjacent to the substrate 111.

Between the insulation layer 116 on a top surface of a specific insulation material of the insulation materials 112 and the insulation layer 116 on an undersurface of an insulation layer provided on a top surface of the specific insulation material, a conductive material extending along the first direction is provided. For example, the first conductive materials 221 to 281 extending along the first direction are provided between the insulation materials 112. Also, the conductive material 291 extending along the first direction is provided at a region above the uppermost insulation material 112. For example, the first conductive materials 211 to 291 may be a metallic material. For example, the first conductive materials 211 to 291 may be a conductive material such as polysilicon.

The same structure as that disposed on the substrate 111 between the first and second doping regions 311 and 312 is provided on the substrate 111 between the second and third doping regions 312 and 313. For example, the plurality of insulation materials 112 extending along the first direction, the plurality of pillars 113 which are sequentially arranged along the first direction and penetrate the plurality of insulation materials 113 along the third direction, the insulation layer 116 provided on the plurality of insulation materials 112 and the exposed surfaces of the plurality of pillars 112, and the plurality of first conductive materials 212 to 292 extending along the first direction are provided on the substrate 111 between the second and third doping regions 312 and 313.

The same structure as that disposed on the substrate 111 between the first and second doping regions 311 and 312 is provided on the substrate 111 between the third and fourth doping regions 313 and 314. For example, the plurality of insulation materials 112 extending along the first direction, the plurality of pillars 113 which are sequentially arranged along the first direction and penetrate the plurality of insulation materials 113 along the third direction, the insulation layer 116 provided on the plurality of insulation materials 112 and the exposed surfaces of the plurality of pillars 112, and the plurality of first conductive materials 213 to 293 extending along the first direction are provided on the substrate 111 between the third and fourth doping regions 313 and 314.

Drains 320 are respectively provided on the plurality of pillars 113. For example, the drains 320 may include a silicon material doped with a second-type material. For example, the drains 320 may include a silicon material doped with an n-type material. Hereinafter, it is assumed that the drains 320 include a silicon material doped with an n-type material. However, the drains 320 are not limited to including n-type silicon materials. For example, the width of each drain 320 may be greater than the width of the pillar 113 corresponding thereto. For example, each drain 320 may be provided in the shape of a pad on the top surface of the corresponding pillar 113.

Second conductive materials 331 to 333 extending in the third direction are provided on the drains 320. The second conductive materials 331 to 333 are arranged along the first direction. The second conductive materials 331 to 333 are respectively connected to the drains 320 in the corresponding region. For example, the drains 320 and the second conductive material 333 extending in the third direction may be connected to each other through respective contact plugs. For example, the second conductive materials 331 to 333 may be a metallic material. For example, the second conductive materials 331 to 333 may be a conductive material such as polysilicon.

In FIGS. 5 and 6, each pillar 113 forms a NAND string NS together with the insulation film 116 and the conductive lines 211 to 291, 212 to 292, and 213 to 293 extending along the first direction. The NAND string NS includes a plurality of transistor structures TS. The transistor structure TS will be more fully described with reference to FIG. 7.

Figure 7:
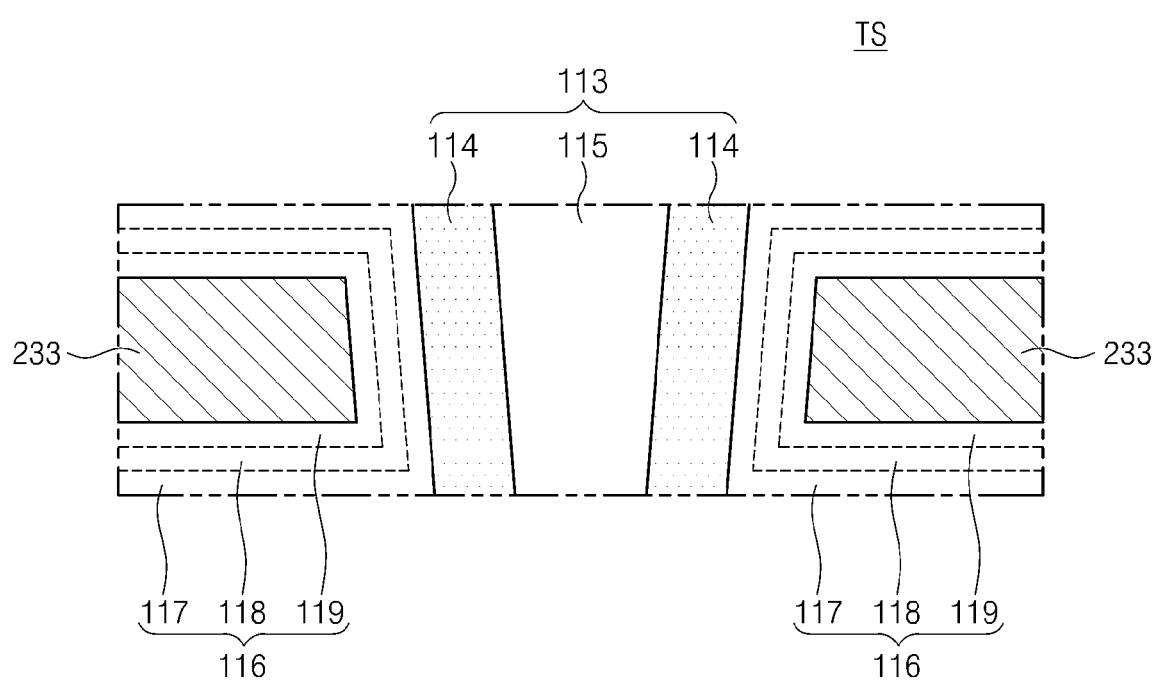
FIG. 7 is a cross-sectional view illustrating a transistor structure shown in FIG. 6.

FIG. 7 is a cross-sectional view illustrating a transistor structure TS shown in FIG. 6. Referring to FIGS. 5 to 7, an insulation layer 116 includes first, second, and third sub insulation layers 117, 118 and 119.

P-type silicon 114 of the pillar 113 may act as a body. The first sub insulation layer 117 adjacent to the pillar 113 may act as a tunneling insulation layer. For example, the first sub insulation layer 117 adjacent to the pillar 113 may include a thermal oxide layer.

The second sub insulation layer 118 may act as a charge storage layer. For example, the second sub insulation layer 118 may act as a charge trap layer. For example, the second sub insulation layer 118 may include a nitride layer or a metal oxide layer (e.g., an aluminum oxide layer, a hafnium oxide layer, and so on).

The third sub insulation layer 119 adjacent to a first conductive material 233 may act as a blocking insulation layer. For example, the third sub insulation layer 119 adjacent to the first conductive material 233 extending in the first direction may have a mono-layered or multi-layered structure. The third sub insulation layer 119 may be a high dielectric layer (e.g., an aluminum oxide layer, a hafnium oxide layer, and so on) having a higher dielectric constant than the first and second sub insulation layers 117 and 118.

The first conductive material 233 may act as a gate (or, a control gate). That is, the first conductive material 233 acting as the gate (or control gate), the third sub insulation layer 119 acting as the blocking insulation layer, the second sub insulation layer 118 acting as the charge trap layer, the first sub insulation layer 117 acting as the tunneling insulation layer, and the surface layer 114 that contains p-type silicon and acts as the body, may form a transistor (or memory cell transistor structure). For example, the first to third sub insulation layers 117 to 119 may form an ONO structure (oxide-nitride-oxide). Hereinafter, the surface layer 114 of the pillar 113 containing p-type silicon is referred to as the body in the second direction.

A memory block BLKi includes a plurality of pillars 113. That is, the memory block BLKi includes the plurality of NAND strings NS. More specifically, the memory block BLKi includes a plurality of NAND strings NS extending in the second direction (or, a direction perpendicular to a substrate).

Each of the NAND strings NS includes a plurality of transistor structures TS which are disposed along the second direction. At least one of the plurality of transistor structures TS of each NAND string NS acts as a string selection transistor SST. At least one of the plurality of transistor structures TS of each NAND string acts as a ground selection transistor GST.

The gates (or control gates) correspond to the first conductive materials 211 to 291, 212 to 292, and 213 to 293 extending in the first direction. That is, the gates (or control gates) form word lines WL and at least two selection lines SL (e.g., at least one string selection line SSL and at least one ground selection line GSL) extending in the first direction.

The second conductive materials 331 to 333 extending in the third direction are connected to one ends of the NAND strings NS. For example, the second conductive materials 331 to 333 extending in the third direction act as bit lines BL. That is, in one memory block BLKi, one bit line BL is connected to the plurality of NAND strings.

Second type doping regions 311 to 314 extending in the first direction are provided at the other ends of the NAND strings NS. The second type doping regions 311 to 314 extending in the first direction act as common source lines CSL.

In summary, the memory block BLKi includes the plurality of NAND strings NS extending in a direction (second direction) perpendicular to the substrate 111 and operates as a NAND flash memory block (e.g., charge trap type) in which the plurality of NAND strings NS are connected to one bit line BL.

In FIGS. 5 to 7, it has been described that the first conductive materials 211 to 291, 212 to 292, and 213 to 293 are provided on nine layers. However, the first conductive materials 211 to 291, 212 to 292, and 213 to 293 are not limited to being provided on the nine layers. For example, conductive materials extending in the first direction may be provided upon eight layers, sixteen layers, or a plurality of layers. That is, in a NAND string, the number of transistors is 8, 16, or a plurality.

In FIGS. 5 to 7, it has been described that three NAND strings NS are connected to one bit line BL. However, it is not limited that three NAND strings NS are connected to one bit line BL. For example, m NAND strings NS may be connected to one bit line BL in the memory block BLKi. Here, the number of the first conductive materials 211 to 291, 212 to 292, and 213 to 293 extending in the first direction and the number of doping regions 311 to 314 acting as the common source line CSL may also be adjusted so as to correspond to the number of NAND strings NS connected to one bit line BL.

In FIGS. 5 to 7, it has been described that three NAND strings NS are connected to one conductive material extending in the first direction. However, it is not limited that three NAND strings NS are connected to one conductive material. For example, n NAND strings NS may be connected to one conductive material. Here, the number of bit lines 331 to 333 extending in the third direction may also be adjusted to correspond to the number of NAND strings NS connected to one conductive material.

As illustrated in FIGS. 5 to 7, a width of a pillar 113 varies according to a height of a memory cell MC. For example, the width of the pillar 113 may vary due to a process characteristic or error. For example, the lower a height of a memory cell MC, that is, the greater a distance between a string selection line SSL and a word line WL, the width of the pillar 113 may decrease.

The pillar 113 encompasses the silicon oxide film 117 acting as a tunneling insulation film, a silicon nitride film 118 acting as a charge storage film, and a silicon oxide film 119 acting as a blocking insulation film. An electric field is generated between a gate (or, a control gate) and the body 114 due to a voltage difference between the gate (or, a control gate) and the body 114. The electric field may be distributed to the tunneling insulation film 117, the charge storage film 118, and the blocking insulation film 119.

The Fowler-Nordheim tunneling may be caused by the electric field distributed to the tunneling insulation film 117. That is, the electric field distributed to the tunneling insulation film 117 may enable a memory cell to be programmed or erased. The amount of charges trapped in the charge storage film 118 at a program operation or the amount of charges discharged from the charge storage film at an erase operation may be decided according to the electric field distributed to the tunneling insulation film 117.

The electric field may be distributed to the tunneling insulation film 117, the charge storage film 118, and the blocking insulation film 119, based on their capacitance. As a width of the pillar 113 decreases, an area ratio of the tunneling insulation film 117 to the blocking insulation film decreases. As an area ratio of the tunneling insulation film 117 to the blocking insulation film decreases, a ratio of capacitance of the tunneling insulation film 117 to capacitance of the blocking insulation film 119 decreases. The electric field distributed to the tunneling insulation film 117 increases in proportion to a decrease in a ratio of capacitance of the tunneling insulation film 117 to capacitance of the blocking insulation film 119.

Thus, as the width of the pillar 113 decreases, there increases the amount of charges trapped in the charge storage film 118 at a program operation or the amount of charges discharged from the charge storage film at an erase operation. That is, a variation in a width of the pillar 113 causes a change in the tunneling effect, so increment or decrement in threshold voltages of memory cells MC1 to MC7 at a program operation or an erase operation varies.

To compensate for a variation in the tunneling effect (or, threshold voltages) of memory cells according to a width of the pillar 113, an address decoder 120 (refer to FIG. 2) and a voltage generator 130 according to an embodiment of the inventive concepts are configured to adjust a level of a word line voltage, which is to be applied to a word line WL, based on a location of the word line WL. In example embodiments, the address decoder 120 and the voltage generator 130 are configured to adjust a selection voltage to be applied to a selection word line, a non-selection voltage to be applied to an unselected word line, and a word line erase voltage to be applied at an erase operation.

Figure 8:
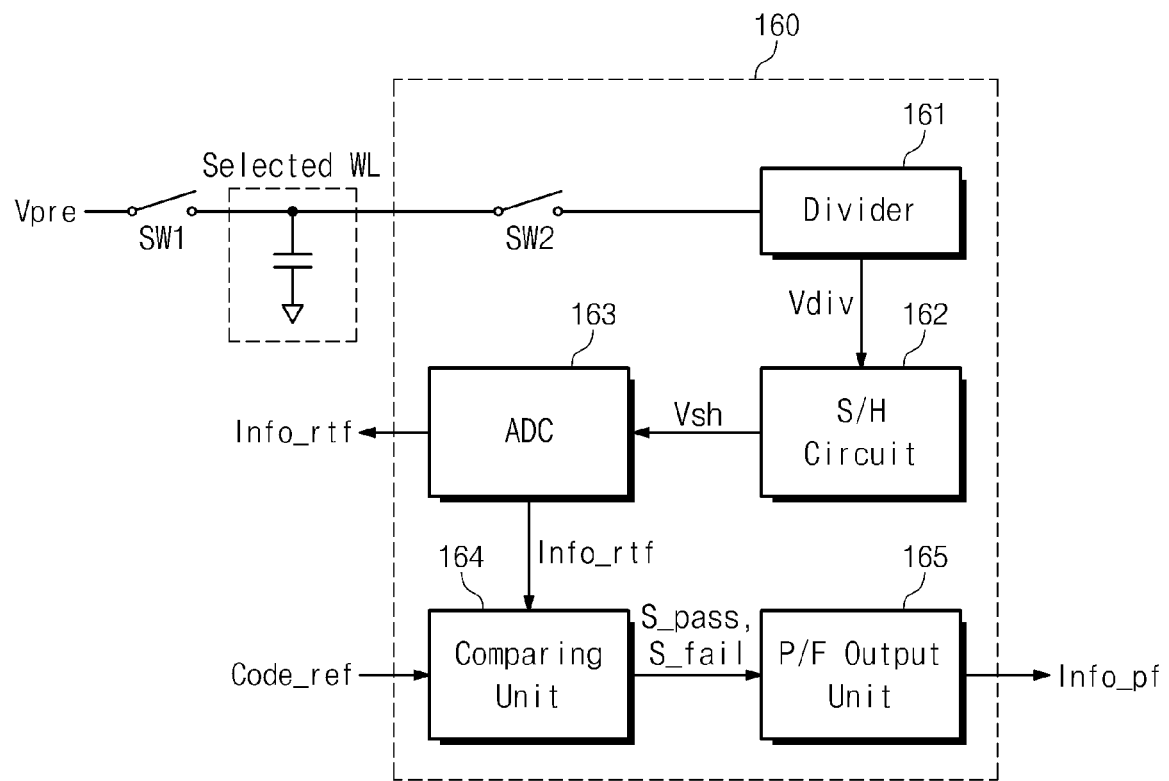
FIG. 8 is a block diagram schematically illustrating a runtime failure detector shown in FIGS. 1 and 2.

FIG. 8 is a block diagram schematically illustrating a runtime failure detector shown in FIGS. 1 and 2. Referring to FIG. 8, a runtime failure detector 160 comprises a voltage divider 161, a sample/hold circuit 162, an analog-to-digital converter 163, a comparing unit 164, and a pass/fail output unit 165.

Control logic 150 (refer to FIG. 2) pre-charges a selected word line with a pre-charge voltage Vpre and floats the selected word line. For example, the pre-charge voltage Vpre may be a program voltage or a read voltage when a nonvolatile memory device 100 is in operation. The pre-charge voltage Vpre is supplied to the selected word line via a first switch SW1. The selected word line may be modeled as a capacitor. If the first switch SW1 is turned on, the selected word line is pre-charged with the pre-charge voltage Vpre. If the first switch SW1 is turned off, the selected word line is floated. After the selected word line is floated, the control logic 150 turns a second switch SW2 on. If the second switch SW2 is turned on with the selected word line normal, the selected word line may keep a constant voltage. If the second switch SW2 is turned on with the selected word line abnormal, a voltage on the selected word line may decrease.

The voltage divider 161 reduces a voltage on the selected word line according to a specific ratio. The voltage divider 161 reduces a voltage on the selected word line for processing in the runtime failure detector 160. For example, the voltage divider 161 may be formed of resistors that are connected in series and have different values. The voltage divider 161 reduces a voltage on the selected word line according to a specific ratio to output a division voltage Vdiv. The division voltage Vdiv may be provided to the sample/hold circuit 162.

The sample/hold circuit 162 converts the division voltage Vdiv into a step-shaped sample/hold voltage Vsh for convenience of an operation of the analog-to-digital converter 163.

The analog-to-digital converter 163 converts the sample/hold voltage Vsh into runtime failure information Info_rtf. For example, the runtime failure information Info_rtf may be a digital code indicating how much a voltage on the selected word line decreases. The analog-to-digital converter 163 divides a voltage range between specific voltages (e.g., 1 V and 2V) into a plurality of intervals. The analog-to-digital converter 163 outputs a digital code corresponding to an interval to which the sample/hold voltage Vsh belongs. The runtime failure information Info_rtf is transmitted to a controller 200. Also, the runtime failure information Info_rtf is sent to the comparing unit 164.

The controller 200 decides a state of the selected word line according to the runtime failure information Info_rtf. For example, based on the runtime failure information Info_rtf, the controller 200 divides a state of the selected word line into, but not limited to, three states: A, B, and C. In the A state where a value of the runtime failure information Info_rtf is great, the controller 200 sets the selected word line to a normal word line. In the C state where a value of the runtime failure information Info_rtf is small, the controller 200 sets the selected word line to a defective word line. The controller 200 blocks an access to the defective word line or to a memory block including the defective word line. In the B state where a value of the runtime failure information Info_rtf is between values corresponding to the A and C states, the controller 200 sets the selected word line to a runtime failure word line. The controller 200 may check whether a runtime failure word line or a memory block including the runtime failure word line occurs, whenever an erase operation is carried out.

The comparing unit 164 receives a reference code Code_ref from the controller 200. For example, the reference code Code_ref may be a specific digital code. The comparing unit 164 compares the runtime failure information Info_rtf and the reference code Code_ref. The comparing unit 164 provides the pass/fail output unit 165 with a word line pass signal S_pass or a word line fail signal S_fail. For example, if a value of the runtime failure information Info_rtf is greater than or equal to the reference code Code_ref, the comparing unit 164 generates the word line pass signal S_pass. If a value of the runtime failure information Info_rtf is smaller than the reference code Code_ref, the comparing unit 164 generates the word line fail signal S_fail.

The pass/fail output unit 165 outputs the pass/fail information Info_pf according to the word line pass signal S_pass or the word line fail signal S_fail. For example, the pass/fail information Info_pf may include whether failure occurs at a selected word line. Also, the pass/fail information Info_pf may include whether failure occurs at a memory block including a selected word line. Based on setting, the pass/fail output unit 165 outputs whether failure occurs at a selected word line or at a memory block including a selected word line.

The pass/fail information Info_pf is transmitted to the controller 200. The controller 200 blocks an access to a selected word line or a memory block including a selected word line, according to the pass/fail information Info_pf. Also, the pass/fail information Info_pf is transmitted to the control logic 150. The control logic 150 may be configured to block an access to a selected word line or a memory block including a selected word line according to the pass/fail information Info_pf.

Figure 9:
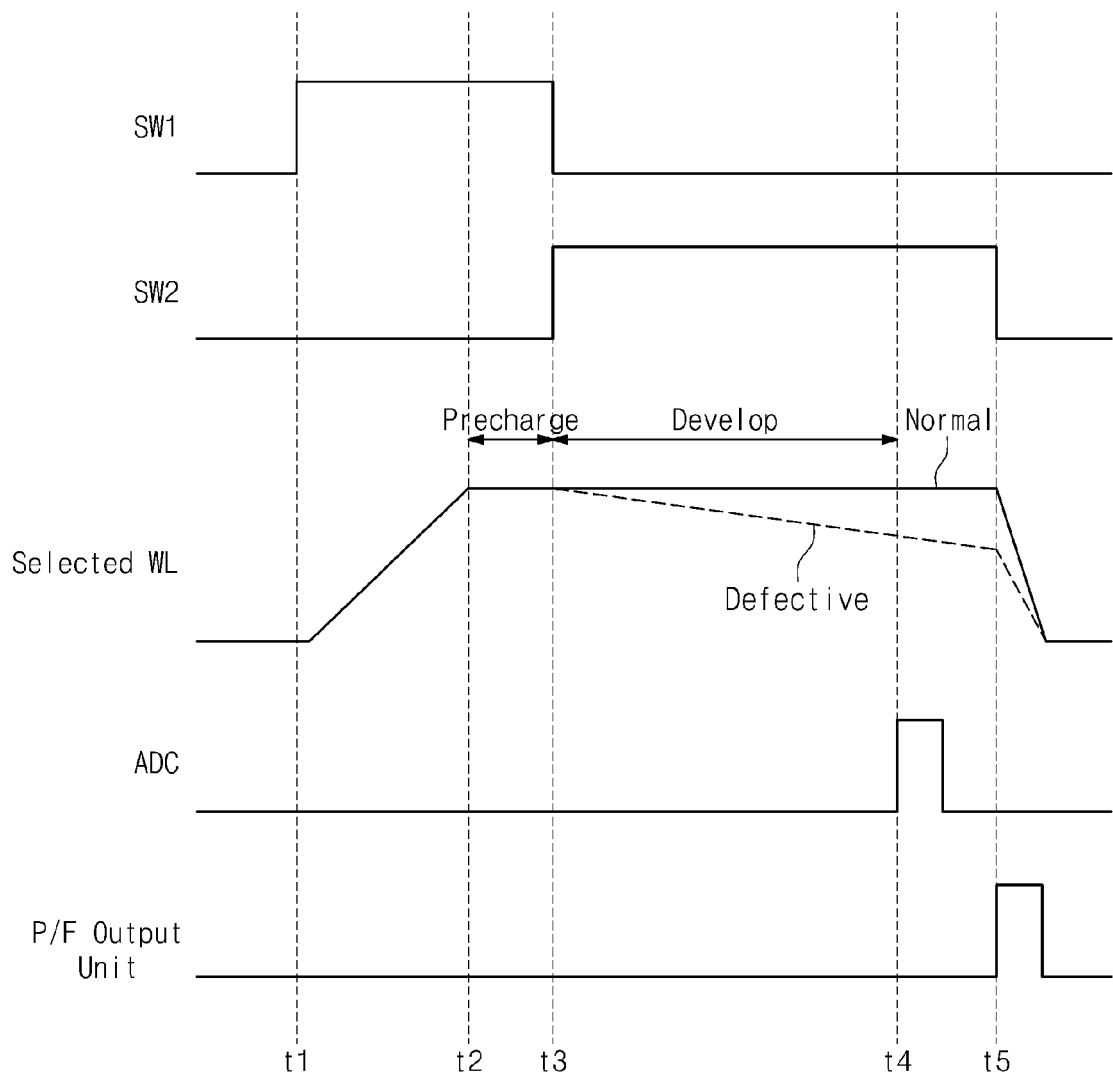
FIG. 9 is a timing diagram for describing an operation of a runtime failure detector shown in FIG. 8.

FIG. 9 is a timing diagram for describing an operation of a runtime failure detector shown in FIG. 8. Referring to FIGS. 8 and 9, at t1, a first switch SW1 is turned on, so a selected word line starts to be charged. The selected word line is pre-charged between t2 and t3. At t3, the first switch SW1 is turned off, and the second switch SW2 is turned on.

The selected word line is developed between t3 and t4. If the selected word line is normal, a voltage on the selected word line is maintained constantly. In contrast, a voltage of the selected word line decreases when the selected word line is defective.

At t4, an analog-to-digital converter 163 generates runtime failure information Info_rtf. At t5, a pass/fail output unit 165 outputs pass/fail information Info_pf.

Figure 10:
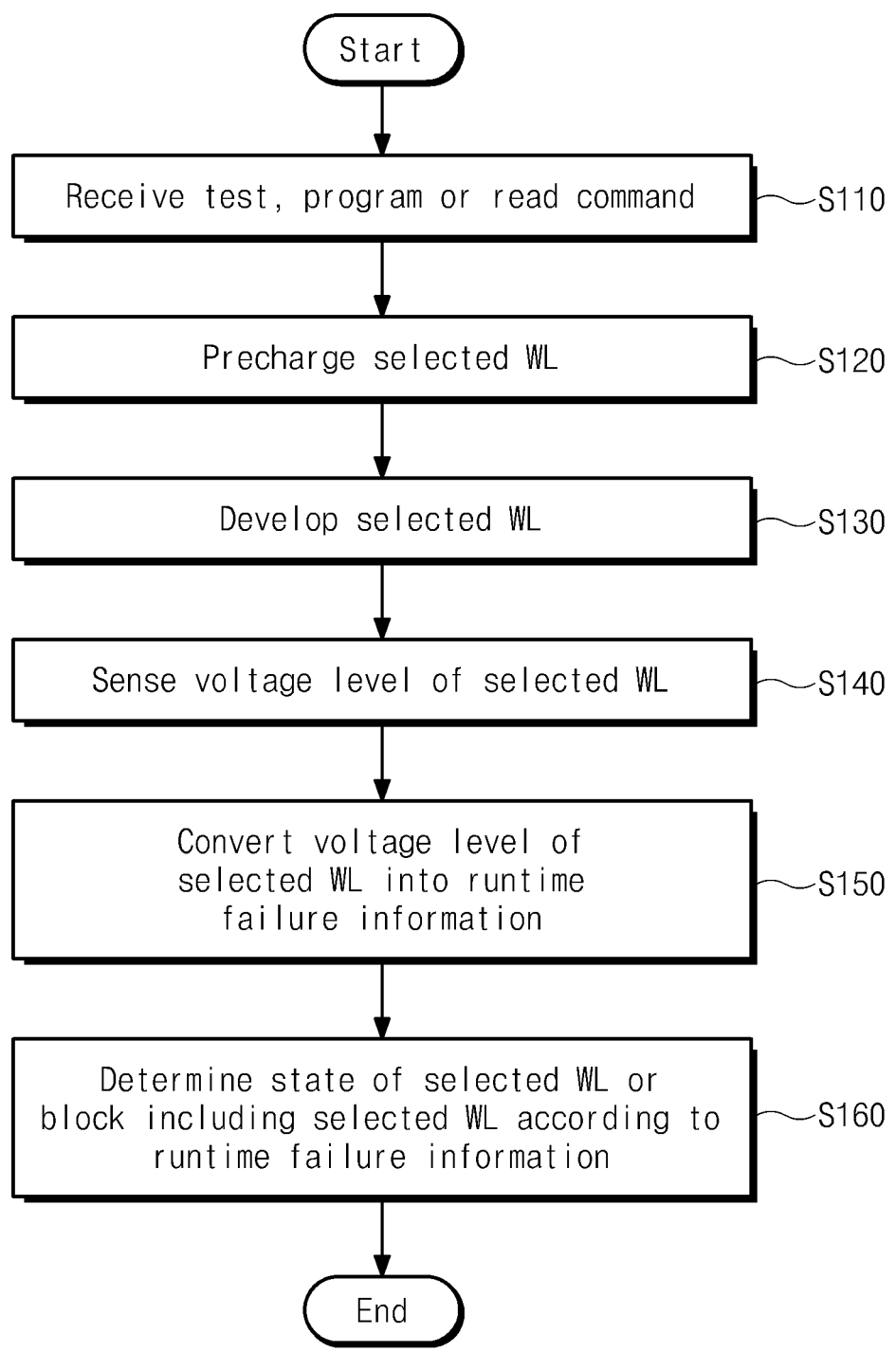
FIG. 10 is a flow chart schematically illustrating a method of detecting runtime failure, according to an embodiment of the inventive concepts.

FIG. 10 is a flow chart schematically illustrating a method of detecting runtime failure, according to an embodiment of the inventive concepts. Referring to FIG. 10, a memory system according to the inventive concepts decides a state of a selected word line or a state of a memory block including the selected word line, based on runtime failure information Info_rtf.

In step S110, a controller 200 receives a test, program, or read command about the selected word line. The controller 200 controls a nonvolatile memory device 100 such that a test, program, or read operation about the selected word line is carried out according to the test, program, or read command.

In step S120, the nonvolatile memory device 100 pre-charges the selected word line. For example, a first switch SW1 shown in FIG. 8 is turned on. If the first switch SW1 is turned on, the selected word line is charged with a pre-charge voltage Vpre. If the first switch SW1 is turned off after the selected word line is charged, the selected word line is floated.

In step S130, a voltage on the selected word line floated is developed. For example, in FIG. 8, the first switch SW1 is turned off, and a second switch SW2 is turned on. If the selected word line is defective, a voltage on the selected word line may decrease.

In step S140, a runtime failure detector 160 detects a voltage level of the selected word line.

In step S150, the runtime failure detector 160 converts the detected voltage level of the selected word line into runtime failure information Info_rtf. For example, in FIG. 8, an analog-to-digital converter 163 receives a sample/hold voltage Vsh to convert it into the runtime failure information Info_rtf as a digital code.

In step S160, a controller 200 determines a state of the selected word line or a state of a memory block including the selected word line, based on the runtime failure information Info_rtf. For example, the controller 200 classifies a state of the selected word line as one of A, B, and C states, based on the runtime failure information Info_rtf.

In the A state where a value of the runtime failure information Info_rtf is great, the controller 200 sets the selected word line to a normal word line. In the C state where a value of the runtime failure information Info_rtf is small, the controller 200 sets the selected word line to a defective word line. The controller 200 blocks an access to the defective word line or to a memory block including the defective word line. In the B state where a value of the runtime failure information Info_rtf is between values corresponding to the A and C states, the controller 200 sets the selected word line to a runtime failure word line. The controller 200 may check whether a runtime failure word line or a memory block including the runtime failure word line occurs, whenever an erase operation is carded out.

Figure 11:
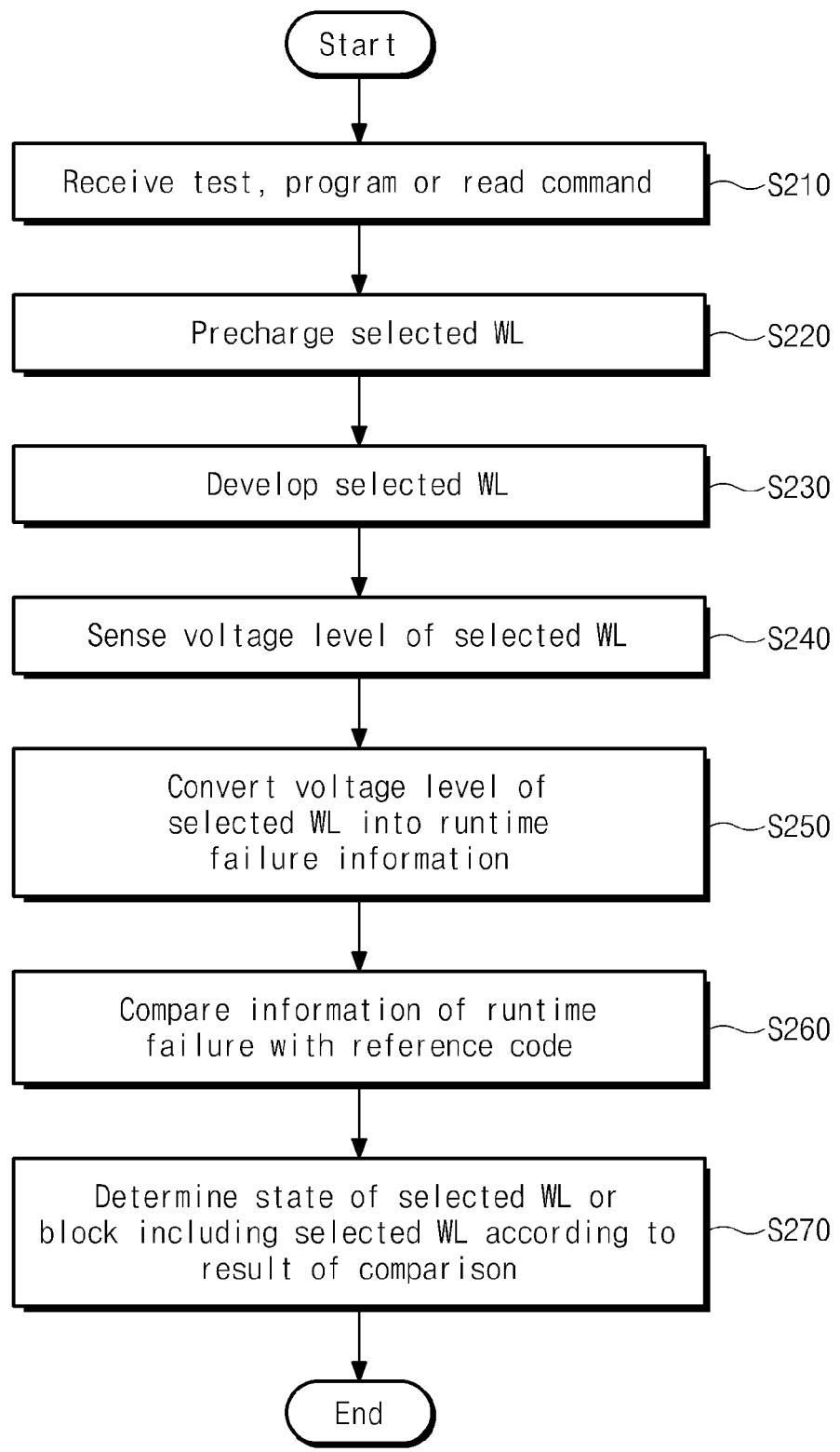
FIG. 11 is a flow chart schematically illustrating a method of detecting runtime failure, according to another embodiment of the inventive concepts.

FIG. 11 is a flow chart schematically illustrating a method of detecting runtime failure, according to another embodiment of the inventive concepts. Referring to FIG. 11, a memory system according to the inventive concepts decides a state of a selected word line or a state of a memory block including the selected word line, based on pass/fail information Info_pf.

In step S210, a controller 200 receives a test, program, or read command about the selected word line. The controller 200 controls a nonvolatile memory device 100 such that a test, program, or read operation about the selected word line is carried out according to the test, program, or read command.

In step S220, the nonvolatile memory device 100 pre-charges the selected word line. For example, a first switch SW1 shown in FIG. 8 is turned on. If the first switch SW1 is turned on, the selected word line is charged with a pre-charge voltage Vpre. If the first switch SW1 is turned off after the selected word line is charged, the selected word line is floated.

In step S230, a voltage on the selected word line floated is developed. For example, in FIG. 8, the first switch SW1 is turned off, and a second switch SW2 is turned on. If the selected word line is defective, a voltage on the selected word line may decrease.

In step S240, a runtime failure detector 160 detects a voltage level of the selected word line.

In step S250, the runtime failure detector 160 converts the detected voltage level of the selected word line into runtime failure information Info_rtf. For example, in FIG. 8, an analog-to-digital converter 163 receives a sample/hold voltage Vsh to convert it into the runtime failure information Info_rtf as a digital code.

In step S260, the runtime failure detector 160 compares the runtime failure information Info_rtf with a reference code Code_ref. For example, a comparing unit 164 shown in FIG. 8 compares the runtime failure information Info_rtf and the reference code Code_ref. If a value of the runtime failure information Info_rtf is greater than or equal to the reference code Code_ref, the comparing unit 164 generates a word line pass signal S_pass. If a value of the runtime failure information Info_rtf is smaller than the reference code Code_ref, the comparing unit 164 generates a word line fail signal S_fail.

Also, a pass/fail output unit 165 outputs pass/fail information Info_pf according to the word line pass signal S_pass or the word line fail signal S_fail. For example, the pass/fail information Info_pf may include whether failure occurs at the selected word line. Also, the pass/fail information Info_pf may include whether failure occurs at a memory block including the selected word line. Based on setting, the pass/fail output unit 165 outputs whether failure occurs at the selected word line or at the memory block including the selected word line.

In step S270, a memory system according to the inventive concepts determines a state of the selected word line or a state of a memory block including the selected word line, based on the comparison result of step S260. For example, the pass/fail information Info_pf is transmitted to the controller 200. The controller 200 blocks an access to the selected word line or the memory block including the selected word line, according to the pass/fail information Info_pf. Also, the pass/fail information Info_pf is transmitted to control logic 150. The control logic 150 may be configured to block an access to the selected word line or the memory block including the selected word line according to the pass/fail information Info_pf.

Figure 12:
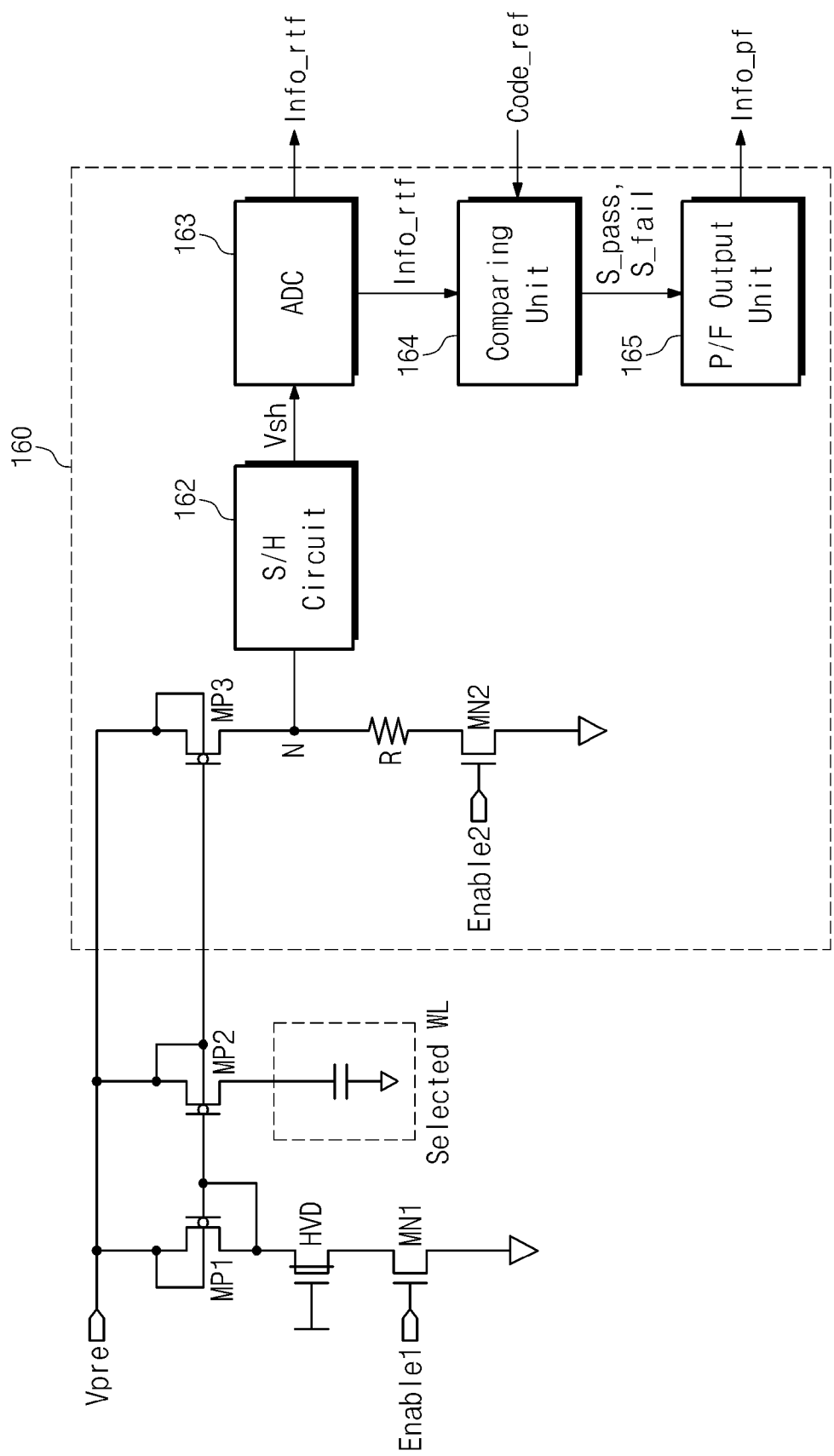
FIG. 12 is a block diagram schematically illustrating a runtime failure detector shown in FIGS. 1 and 2, according to another embodiment of the inventive concepts.

FIG. 12 is a block diagram schematically illustrating a runtime failure detector shown in FIGS. 1 and 2, according to another embodiment of the inventive concepts. Referring to FIG. 12, a runtime failure detector 160 senses a current of a selected word line to generate runtime failure information Info_rtf and pass/fail information Info_pf.

Control logic 150 (refer to FIG. 2) controls to charge a selected word line with a pre-charge voltage Vpre. For example, the pre-charge voltage Vpre may be a program voltage or a read voltage when a nonvolatile memory device 100 is in operation.

The selected word line may be modeled as a capacitor. First to third PMOS transistors MP1 to MP3 may constitute a current mirror. If a first NMOS transistor MN1 is turned on according to a first enable signal Enable1, the selected word line is charged with a current flowing via the second PMOS transistor MP2 according to a current mirror structure. If the selected word line is floated after it is charged, the control logic 150 turns a second NMOS transistor MN2 using a second enable signal Enable2. In the event that the selected word line is normal, a constant current flows into a resistor R when the second NMOS transistor MN2 is turned on. A voltage on a node N is maintained constantly. In the event that the selected word line is defective, the amount of current flowing into the register R when the selected word line is defective is greater than the amount of current flowing into the register R when the selected word line is normal. Thus, a voltage on the node N increases.

As compared with the event that a voltage on the selected word line is detected (FIG. 8), the event that a current on the selected word line is detected using a current mirror need not require a developing step. Thus, it is possible to reduce a time taken for a runtime failure detector 160 to produce runtime failure information Info_rtf. Also, the runtime failure detector 160 may easily produce the runtime failure information Info_rtf at a read or program operation.

A sample/hold circuit 162 converts a voltage on the node N into a step-shaped sample/hold voltage Vsh for convenience of an operation of an analog-to-digital converter 163.

The analog-to-digital converter 163 converts the sample/hold voltage Vsh into runtime failure information Info_rtf. For example, the runtime failure information Info_rtf may be a digital code indicating how much a current on the selected word line increases. The analog-to-digital converter 163 divides a voltage range between specific voltages (e.g., 1 V and 2V) into a plurality of intervals. The analog-to-digital converter 163 outputs a digital code corresponding to an interval to which the sample/hold voltage Vsh belongs. The runtime failure information Info_rtf is transmitted to a controller 200. Also, the runtime failure information Info_rtf is sent to a comparing unit 164.

The controller 200 determines a state of the selected word line according to the runtime failure information Info_rtf. For example, based on the runtime failure information Info_rtf, the controller 200 divides a state of the selected word line into, but not limited to, three states: A, B, and C. In the A state where a value of the runtime failure information Info_rtf is small, the controller 200 sets the selected word line to a normal word line. In the C state where a value of the runtime failure information Info_rtf is great, the controller 200 sets the selected word line to a defective word line. The controller 200 blocks an access to the defective word line or to a memory block including the defective word line. In the B state where a value of the runtime failure information Info_rtf is between values corresponding to the A and C states, the controller 200 sets the selected word line to a runtime failure word line. The controller 200 may check whether a runtime failure word line or a memory block including the runtime failure word line occurs, whenever an erase operation is carried out.

The comparing unit 164 receives a reference code Code_ref from the controller 200. For example, the reference code Code_ref may be a specific digital code. The comparing unit 164 compares the runtime failure information Info_rtf and the reference code Code_ref. The comparing unit 164 provides a pass/fail output unit 165 with a word line pass signal S_pass or a word line fail signal S_fail. For example, if a value of the runtime failure information Info_rtf is smaller than the reference code Code_ref, the comparing unit 164 generates the word line pass signal S_pass. If a value of the runtime failure information Info_rtf is greater than or equal to the reference code Code_ref, the comparing unit 164 generates the word line fail signal S_fail.

The pass/fail output unit 165 outputs the pass/fail information Info_pf according to the word line pass signal S_pass or the word line fail signal S_fail. For example, the pass/fail information Info_pf may include whether failure occurs at a selected word line. Also, the pass/fail information Info_pf may include whether failure occurs at a memory block including the selected word line. Based on setting, the pass/fail output unit 165 outputs whether failure occurs at a selected word line or at a memory block including a selected word line.

The pass/fail information Info_pf is transmitted to the controller 200. The controller 200 blocks an access to a selected word line or a memory block including a selected word line, according to the pass/fail information Info_pf. Also, the pass/fail information Info_pf is transmitted to the control logic 150. The control logic 150 may be configured to block an access to a selected word line or a memory block including a selected word line according to the pass/fail information Info_pf.

Figure 13:
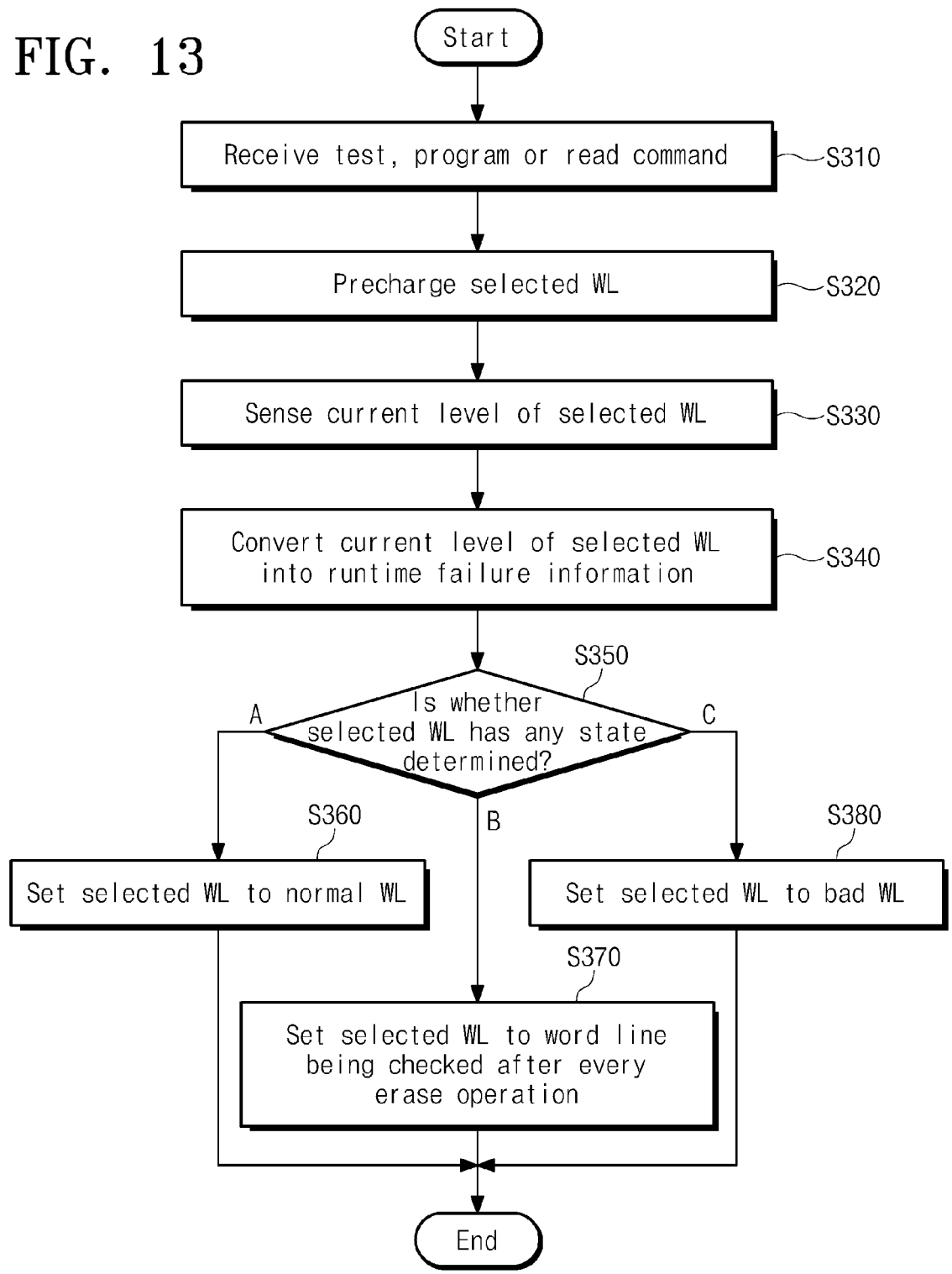
FIG. 13 is a flow chart schematically illustrating a method of detecting runtime failure, according to still another embodiment of the inventive concepts.

FIG. 13 is a flow chart schematically illustrating a method of detecting runtime failure, according to still another embodiment of the inventive concepts. Referring to FIG. 13, a memory system according to the inventive concepts decides a state of a selected word line or a state of a memory block including the selected word line, based on runtime failure information Info_rtf.

In step S310, a controller 200 receives a test, program, or read command about the selected word line. The controller 200 controls a nonvolatile memory device 100 such that a test, program, or read operation about the selected word line is carried out according to the test, program, or read command.

In step S320, the nonvolatile memory device 100 pre-charges the selected word line. For example, a first NMOS transistor MN1 shown in FIG. 12 is turned on. If the first NMOS transistor MN1 is turned on, the selected word line is charged with a pre-charge voltage Vpre, so it is floated.

In step S330, a runtime failure detector 160 detects a current flowing to the selected word line. For example, a voltage on a node N shown in FIG. 12 is decided according to a current flowing into the selected word line, that is, a current flowing into a resistor R according to a current mirror structure. A sample/hold circuit 162 generates a sample/hold voltage Vsh according to a voltage on the node N. As a current flowing into the selected word line is used, a developing step is not required.

In step S340, the runtime failure detector 160 converts the detected voltage on the node N, that is, a voltage on the selected word line into runtime failure information Info_rtf. For example, an analog-to-digital converter 163 shown in FIG. 12 receives a sample/hold voltage Vsh to convert it into the runtime failure information Info_rtf as a digital code. The runtime failure information Info_rtf is provided to the controller 200.

In step S350, the controller 200 determines whether a selected word line has any one of A, B, and C states, based on the runtime failure information Info_rtf. If a value of the runtime failure information Info_rtf is greater than a first reference value, the selected word line is set to the A state. If a value of the runtime failure information Info_rtf is smaller than a second reference value, the selected word line is set to the C state. In the event that a value of the runtime failure information Info_rtf ranges from the A state to the C state, that is, is between the first reference value and the second reference value, the selected word line is set to the B state.

If the selected word line is determined as being the A state where a value of the runtime failure information Info_rtf is greater than the first reference value, the method proceeds to step S360, in which the selected word line is set to a normal word line.

When the selected word line is determined as being the B state where a value of the runtime failure information Info_rtf is between the first and second reference values, the method proceeds to step S370, in which the selected word line is set to a runtime failure word line. The controller 200 may check whether a runtime failure word line or a memory block including the runtime failure word line occurs, whenever an erase operation is carried out.

Finally, when the selected word line is determined as being the C state where a value of the runtime failure information Info_rtf is smaller than the second reference value, the method proceeds to step S380, in which the selected word line is set to a defective word line. The controller 200 blocks an access to the defective word line or a memory block including the defective word line.

Figure 14:
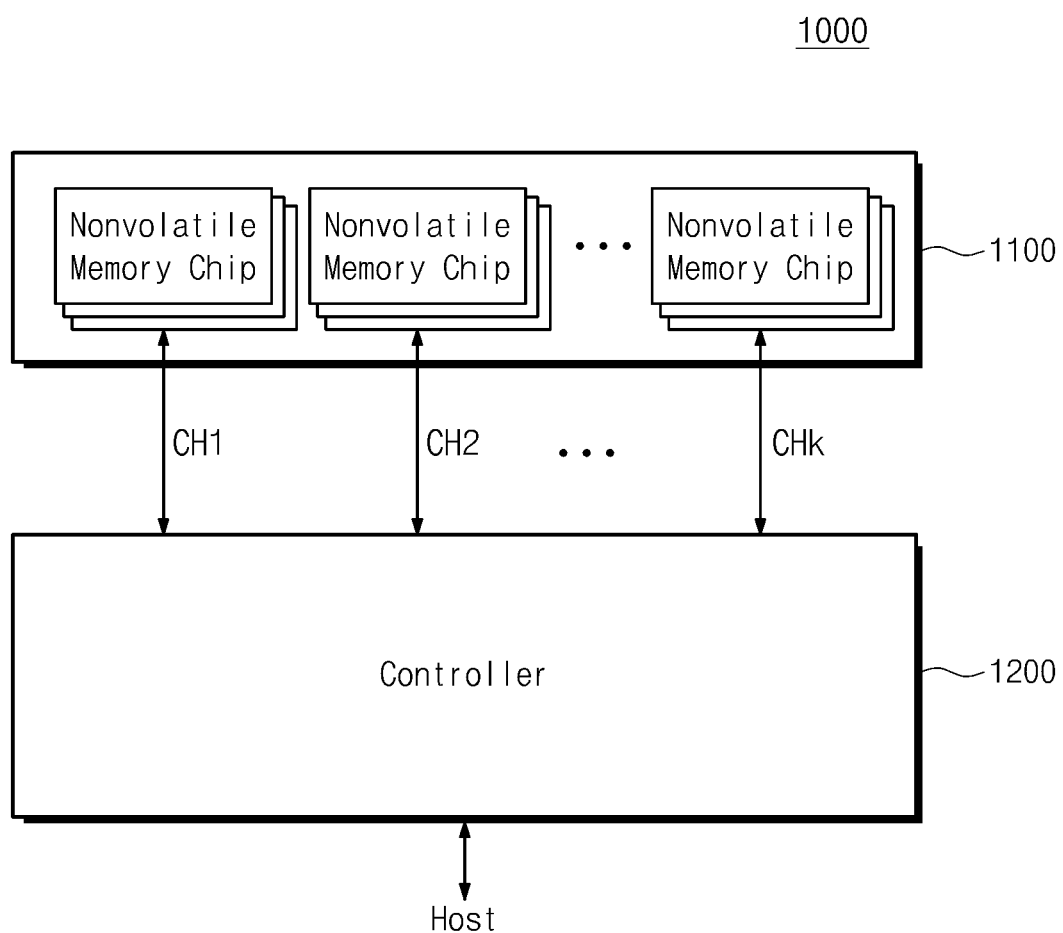
FIG. 14 is a block diagram illustrating a memory system according to another embodiment of the inventive concepts.

FIG. 14 is a block diagram illustrating a memory system according to another embodiment of the inventive concepts. Referring to FIG. 14, a memory system 1000 includes a nonvolatile memory device 1100 and a controller 1200. The nonvolatile memory device 1100 may include a plurality of nonvolatile memory chips, which are divided into a plurality of groups. Nonvolatile memory chips in each group may be configured to communicate with the controller 1200 via one common channel. In example embodiments, the plurality of nonvolatile memory chips may communicate with the controller 1200 via a plurality of channels CH1 to CHk.

In example embodiments, each nonvolatile memory chip may be a nonvolatile memory device 100 described with reference to FIGS. 1 to 13. Each nonvolatile memory chip, as described with reference to FIGS. 1 to 13, generates runtime failure information, based on a failure level of a selected word line.

In FIG. 14, there is described an example where one channel is connected to a plurality of nonvolatile memory chips. However, the memory system 1000 may be modified such that one channel is connected to one nonvolatile memory chip.

Figure 15:
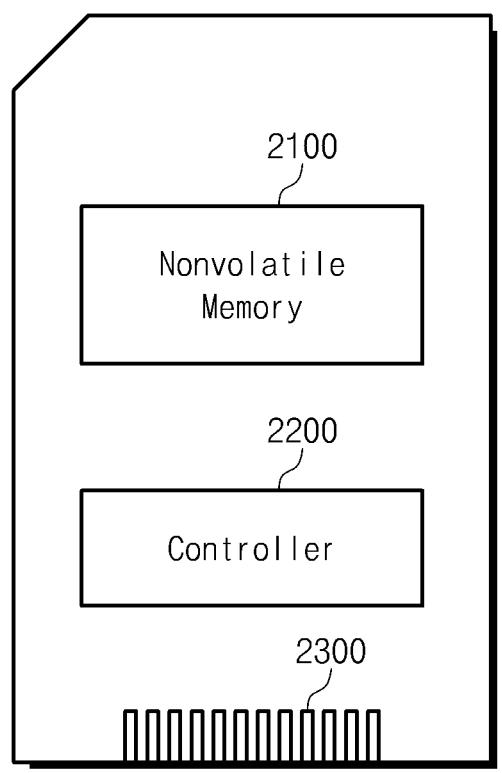
FIG. 15 is a diagram illustrating a memory card according to an embodiment of the inventive concepts.

FIG. 15 is a diagram illustrating a memory card 2000 according to an embodiment of the inventive concepts. Referring to FIG. 15, a memory card 2000 may include a nonvolatile memory device 2100, a controller 2200, and a connector 2300.

The nonvolatile memory device 2100 may be a nonvolatile memory device 100 described with reference to FIGS. 1 to 13. The nonvolatile memory device 2100, as described with reference to FIGS. 1 to 13, generates runtime failure information, based on a failure level of a selected word line. The connector 2300 may electrically connect the memory card 2000 with a host.

The memory card 2000 may be formed of memory cards, such as, but not limited to, a PC (PCMCIA) card, a CF card, an SM (or, SMC) card, a memory stick, a multimedia card (MMC, RS-MMC, MMCmicro), a security card (SD, miniSD, microSD, SDHC), and a universal flash storage (UFS) device.

Figure 16:
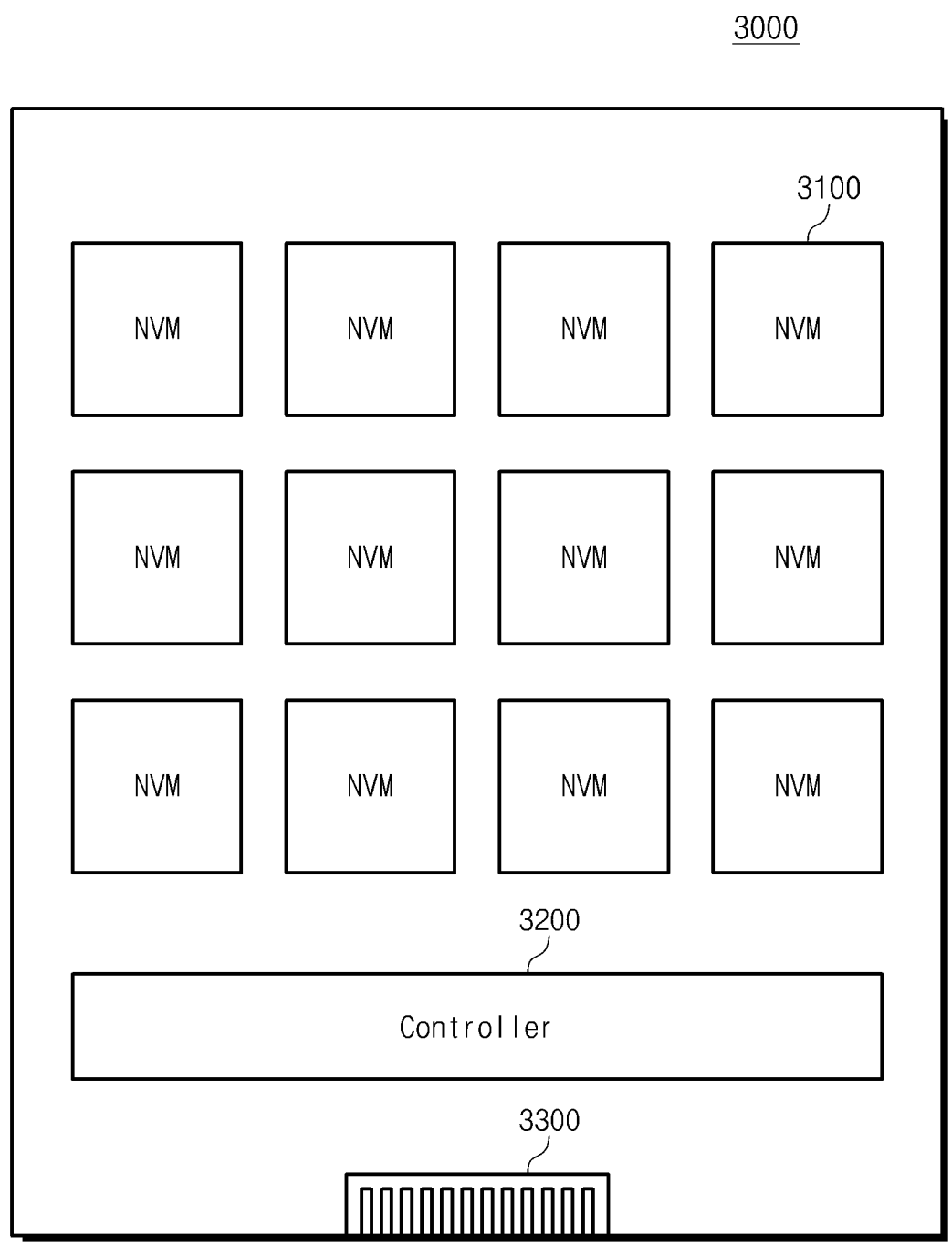
FIG. 16 is a diagram illustrating a solid state drive according to an embodiment of the inventive concepts.

FIG. 16 is a diagram illustrating a solid state drive 3000 according to an embodiment of the inventive concepts. Referring to FIG. 16, a solid state drive 3000 includes a plurality of nonvolatile memory devices 3100, a controller 3200, and a connector 3300.

Each of the nonvolatile memory device 3100 may be a nonvolatile memory device 100 described with reference to FIGS. 1 to 13. Each of the nonvolatile memory devices 3100, as described with reference to FIGS. 1 to 13, generates runtime failure information, based on a failure level of a selected word line. The connector 3300 may electrically connect the SSD 3000 with an external device (e.g., a host).

Figure 17:
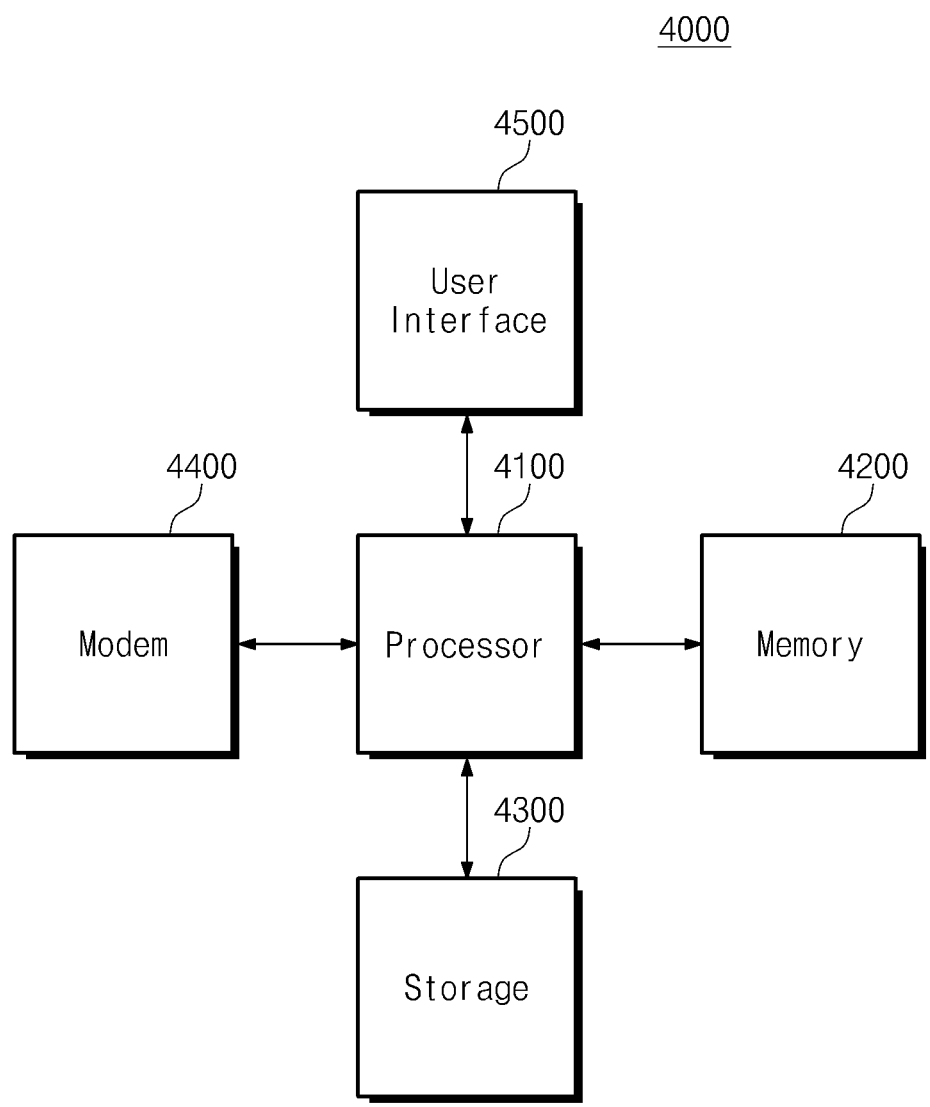
FIG. 17 is a block diagram schematically illustrating a computing device according to an embodiment of the inventive concepts.

FIG. 17 is a block diagram schematically illustrating a computing device 4000 according to an embodiment of the inventive concepts. Referring to FIG. 17, a computing device 4000 includes a processor 4100, a memory 4200, storage 4300, a modem 4400, and a user interface 4500.

The processor 4100 may control an overall operation of the computing device 4000 and may perform a logical operation. The processor 4100 may be formed of a system-on-chip (SoC). The processor 4100 may be a general purpose processor or an application processor.

The memory 4200 communicates with the processor 4100. The memory 4200 may be a working memory (or, a main memory) of the processor 4100 or the computing device 4000. The memory 4200 may include a volatile memory, such as, but not limited to, a static RAM, a dynamic RAM, or a synchronous DRAM or a nonvolatile memory, such as, but not limited to, a flash memory, a phase-change RAM (PRAM), a magnetic RAM (MRAM), a resistive RAM (RRAM), or a ferroelectric RAM (FRAM).

The storage 4300 may be main storage of the computing system 4000. The storage 4300 may be used to store data for a long time. The storage 4300 may include a hard disk drive or a nonvolatile memory device, such as, but not limited to, a flash memory, a PRAM (Phase-change RAM), an MRAM (Magnetic RAM), an RRAM (Resistive RAM), or an FRAM (Ferroelectric RAM).

The storage 4300 may be a nonvolatile memory device 100 described with reference to FIGS. 1 to 13. The storage 4300, as described with reference to FIGS. 1 to 13, generates runtime failure information, based on a failure level of a selected word line.

In example embodiments, the memory 4200 and the storage 4300 may be formed of a nonvolatile memory of a same type. In this case, the memory 4200 and the storage 4300 may be integrated in a semiconductor integrated circuit.

The modem 4400 may communicate with an external device according to a control of the processor 4100. For example, the modem 4400 may communicate with the external device in a wire or wireless manner. The modem 4400 may communicate based on at least one of wireless communications manners, such as, but not limited to, LTE (Long Term Evolution), WiMax, GSM (Global System for Mobile communication), CDMA (Code Division Multiple Access), Bluetooth, NFC (Near Field Communication), WiFi, and RFID (Radio Frequency Identification), or wire communications manners, such as, but not limited to, USB (Universal Serial Bus), SATA (Serial AT Attachment), SCSI (Small Computer Small Interface), Firewire, and PCI (Peripheral Component Interconnection).

The user interface 4500 may communicate with a user according to a control of the processor 4100. For example, the user interface 4500 may include user input interfaces, such as, but not limited to, a keyboard, a keypad, a button, a touch panel, a touch screen, a touch pad, a touch ball, a camera, a microphone, a gyroscope sensor, and a vibration sensor. The user interface 5500 may further include user output interfaces, such as, but not limited to, an LCD, an OLED (Organic Light Emitting Diode) display device, an AMOLED (Active Matrix OLED) display device, an LED, a speaker, and a motor.

While the inventive concepts has been described with reference to example embodiments, it will be apparent to those skilled in the art that various changes and modifications may be made without departing from the spirit and scope of the present invention. Therefore, it should be understood that the above embodiments are not limiting, but illustrative.

What is claimed is:

1. An operating method of a memory system which includes a nonvolatile memory device including memory cells connected to a plurality of word lines, the operating method comprising:
    pre-charging a selected one of the plurality of word lines;
    detecting a variation in a voltage or a current on the selected word line after the selected word line is floated;
    generating runtime failure information by converting the detected variation in the voltage or the current on the selected word line into a digital code; and
    determining a state of the selected word line or a state of a memory block including the selected word line, based on the runtime failure information.

2. The operating method of claim 1, wherein the selected word line or the memory block including the selected word line is determined to be in a normal state when a value of the runtime failure information is greater than a first reference value.

3. The operating method of claim 2, wherein
    the selected word line or the memory block including the selected word line is determined to be in a defective state when a value of the runtime failure information is smaller than a second reference value,
    the second reference value is smaller than the first reference value, and
    an access to the selected word line or the memory block including the selected word line is blocked when the selected word line or the memory block is determined to be in the defective state.

4. The operating method of claim 3, wherein when a value of the runtime failure information is between the first reference value and the second reference value, the runtime failure information about the selected word line is detected whenever an erase operation is performed.

5. A memory system comprising:
    a nonvolatile memory device configured to pre-charge a selected word line, detect a variation in a voltage or a current on the selected word line, and generate runtime failure information by converting the detected variation in the voltage or the current on the selected word line into a digital code; and
    a controller configured to determine a state of the selected word line or a state of a memory block including the selected word line, based on the runtime failure information.

6. The memory system of claim 5, wherein the nonvolatile memory device comprises:
    a memory cell array including memory cells connected to word lines and bit lines;
    an address decoder configured to provide a pre-charge voltage to a selected one of the word lines;
    a voltage generator configured to generate the pre-charge voltage; and
    control logic configured to generate the runtime failure information according to a result of detecting a variation in a voltage or a current on the selected word line after the selected word line is pre-charged with the pre-charge voltage.

7. The memory system of claim 6, wherein the pre-charge voltage includes a program voltage or a read voltage.

8. The memory system of claim 6, wherein the control logic comprises:
    a sample/hold circuit configured to convert the detected variation in the voltage or the current of the selected word line into a step-shaped sample/hold voltage or current; and
    an analog-to-digital converter configured to convert the sample/hold voltage or current into the digital code to generate the runtime failure information.

9. The memory system of claim 8, wherein the control logic further comprises:
    a comparing unit configured to compare the runtime failure information with a reference code to generate a word line pass signal or a word line fail signal; and
    a pass/fail output unit configured to generate pass/fail information in response to the word line pass signal or the word line fail signal.

10. The memory system of claim 9, wherein the controller is configured to block an access to the selected word line or the memory block including the selected word line according to the pass/fail information.

11. The memory system of claim 5, wherein the controller is configured to set the selected word line or the memory block including the selected word line to a normal state when a value of the runtime failure information is greater than a first reference value.

12. The memory system of claim 11, wherein the controller is configured to,
    set the selected word line or the memory block including the selected word line to a defective state when a value of the runtime failure information is smaller than a second reference value, the second reference value being smaller than the first reference value, and
    block an access to the selected word line or the memory block including the selected word line when the selected word line or the memory block is set to the defective state.

13. The memory system of claim 12, wherein when a value of the runtime failure information is between the first reference value and the second reference value, the runtime failure information about the selected word line is detected whenever an erase operation is performed.

14. The memory system of claim 5, wherein the nonvolatile memory device is configured to pre-charge the selected word line and detect the voltage or the current on the selected word line after a developing time elapses.

15. A nonvolatile memory device comprising:
    a memory cell array including memory cells connected to word lines and bit lines;
    an address decoder configured to provide a pre-charge voltage to a selected one of the word lines;
    a voltage generator configured to generate the pre-charge voltage; and
    a control logic configured to,
        detect a variation in a voltage or a current on the selected word line after the selected word line is pre-charged with the pre-charge voltage, and generate the runtime failure information by converting the detected variation in the voltage or the current on the selected word line into a digital code.

16. The nonvolatile memory device of claim 15, wherein the control logic comprises:
    a sample/hold circuit configured to convert the detected variation in the voltage or the current of the selected word line into a step-shaped sample/hold voltage or current; and
    an analog-to-digital converter configured to convert the sample/hold voltage or current into the digital code to generate the runtime failure information.

17. The nonvolatile memory device of claim 16, wherein the control logic further comprises:
    a comparing unit configured to compare the runtime failure information with a reference code to generate a word line pass signal or a word line fail signal; and
    a pass/fail output unit configured to generate pass/fail information in response to the word line pass signal or the word line fail signal.

18. The nonvolatile memory device of claim 15, wherein the pre-charge voltage is a program voltage or a read voltage.

* * * * *